United States Patent [19]
Hommei et al.

[11] Patent Number: 5,633,588
[45] Date of Patent: May 27, 1997

[54] SUPERCONDUCTING MAGNET APPARATUS USING SUPERCONDUCTING MULTILAYER COMPOSITE MEMBER, METHOD OF MAGNETIZING THE SAME AND MAGNETIC RESONANCE IMAGING SYSTEM EMPLOYING THE SAME

[75] Inventors: Takao Hommei, Hitachinaka; Yutaka Takuma, Tokyo; Hirotaka Takeshima, Ryugasaki; Hiroyuki Takeuchi, Kashiwa; Yoshiyuki Miyamoto, Abiko; Kiyoshi Fukutomi, Tokyo; Hajime Kawano, Abiko, all of Japan

[73] Assignee: Hitachi Medical Corporation, Tokyo, Japan

[21] Appl. No.: 525,211

[22] Filed: Sep. 8, 1995

[30] Foreign Application Priority Data

| Sep. 16, 1994 | [JP] | Japan | 6-222196 |
|---|---|---|---|
| Sep. 16, 1994 | [JP] | Japan | 6-222198 |
| Sep. 19, 1994 | [JP] | Japan | 6-223547 |
| Sep. 19, 1994 | [JP] | Japan | 6-223548 |
| Sep. 19, 1994 | [JP] | Japan | 6-223549 |
| Sep. 19, 1994 | [JP] | Japan | 6-223552 |
| Sep. 21, 1994 | [JP] | Japan | 6-226276 |
| Sep. 21, 1994 | [JP] | Japan | 6-226277 |
| Sep. 21, 1994 | [JP] | Japan | 6-226278 |
| Sep. 21, 1994 | [JP] | Japan | 6-226825 |
| Sep. 21, 1994 | [JP] | Japan | 6-226826 |
| Oct. 26, 1994 | [JP] | Japan | 6-262359 |
| Jun. 27, 1995 | [JP] | Japan | 7-160396 |

[51] Int. Cl.$^6$ .................................. G01V 3/00
[52] U.S. Cl. ........................... 324/320; 324/319
[58] Field of Search .................... 324/320, 319, 324/318, 309, 307; 335/216, 296, 299; 505/844

[56] References Cited

U.S. PATENT DOCUMENTS

| 4,876,510 | 10/1989 | Siebold et al. | 324/319 |
|---|---|---|---|
| 4,931,735 | 6/1990 | Overweg et al. | 324/320 |
| 4,985,679 | 1/1991 | McDougall | 324/319 |
| 5,138,326 | 8/1992 | Edwards et al. | 324/319 |

OTHER PUBLICATIONS

JP-A-4-49948.
IEEE Transactions on Applied Superconductivity vol. 3, No. 1, Mar. 1933, pp. 177-180.

*Primary Examiner*—Louis M. Arana
*Attorney, Agent, or Firm*—Antonelli, Terry, Stout & Kraus, LLP

[57] ABSTRACT

A superconducting magnet apparatus which includes a cryostat vessel for containing therein a coolant for realizing superconductivity, a magnetic flux generating unit disposed within the cryostat vessel and including a superconducting multilayer composite member constituting a sustaining medium for a persistent current which generates a magnetic flux along a center axis of a predetermined magnetic field space, and members holding the magnetic field generating unit within the cryostat vessel.

35 Claims, 23 Drawing Sheets

STATE OF SUPERCONDUCTING MULTILAYER COMPOSITE MEMBER

INDUCED CURRENT

EXCITATION CURRENT

EXTERNAL MAGNETIC FIELD

MAGNETIC FLUX DENSITY IN SUPERCONDUCTING MULTILAYER COMPOSITE MEMBER

STATE OF SUPERCONDUCTING MULTILAYER COMPOSITE MEMBER

INDUCED CURRENT

EXCITATION CURRENT

EXTERNAL MAGNETIC FIELD

MAGNETIC FLUX DENSITY OF SUPERCONDUCTING MULTILAYER COMPOSITE MEMBER

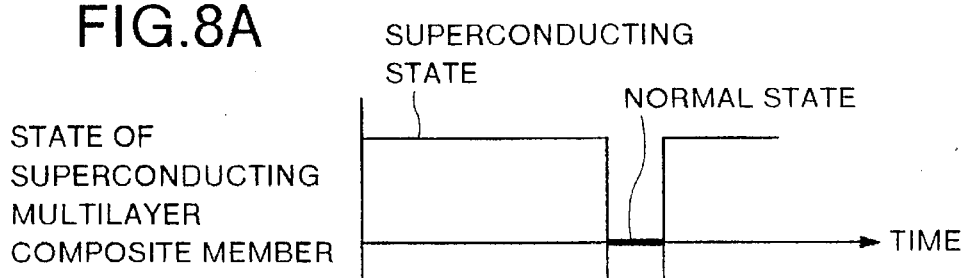
FIG.8A STATE OF SUPERCONDUCTING MULTILAYER COMPOSITE MEMBER
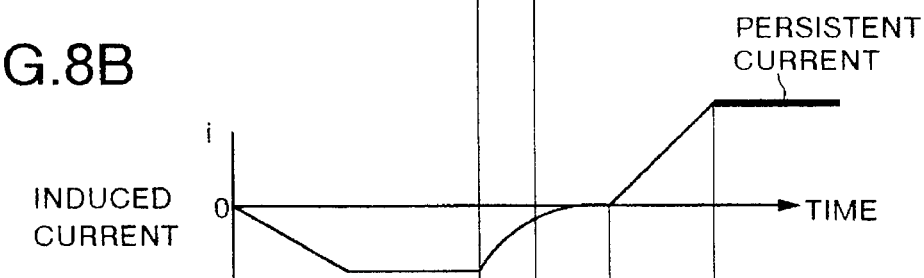
FIG.8B INDUCED CURRENT
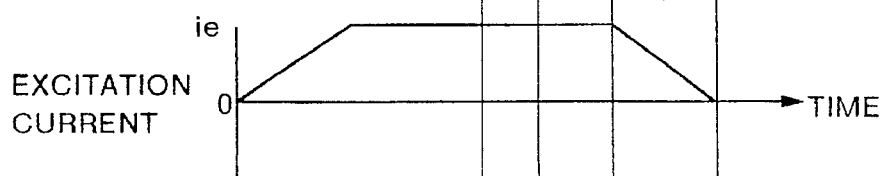
FIG.8C EXCITATION CURRENT
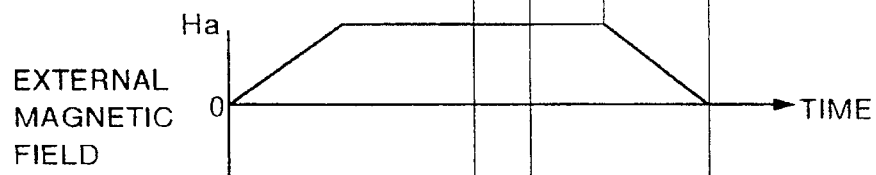
FIG.8D EXTERNAL MAGNETIC FIELD
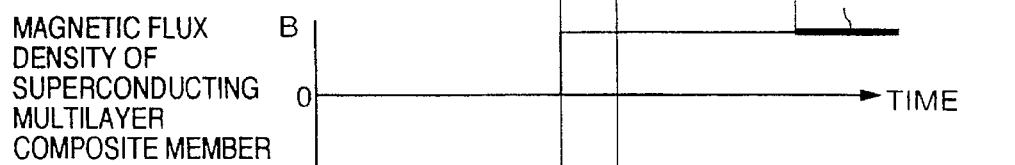
FIG.8E MAGNETIC FLUX DENSITY OF SUPERCONDUCTING MULTILAYER COMPOSITE MEMBER
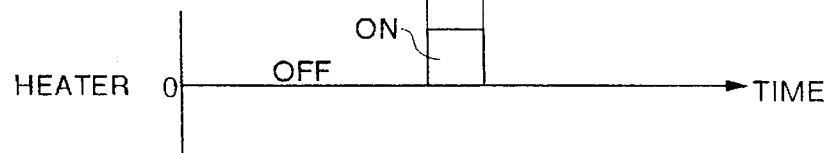
FIG.8F HEATER

SUPERCONDUCTING MAGNET APPARATUS USING SUPERCONDUCTING MULTILAYER COMPOSITE MEMBER, METHOD OF MAGNETIZING THE SAME AND MAGNETIC RESONANCE IMAGING SYSTEM EMPLOYING THE SAME

BACKGROUND OF THE INVENTION

The present invention generally relates to a superconducting magnet apparatus. More particularly, the invention is concerned with a superconducting magnet apparatus in which a superconducting multilayer composite member is made use of as a static magnetic field generating source, a method of magnetizing the superconducting magnet apparatus and a magnetic resonance imaging system in which the superconducting magnet apparatus is employed.

As is well known, the superconducting magnet apparatus finds applications in numerous and various technical or industrial fields. In the conventional superconducting magnet apparatus known heretofore, a superconducting conductor is wound in a coil-like configuration and immersed within liquid helium contained in a cryostat vessel and serving as a coolant for realizing superconductivity, for thereby generating a magnetic field within a predetermined space, as is disclosed in JP-A-4-49948.

However, the conventional superconducting magnet apparatus suffers from a problem that decreasing of the magnetic flux can not be evaded because of connection or contact resistance making appearance in connecting portions of the superconducting conductors forming the coil. Besides, the connection resistance and mechanical deformation of the superconducting coil provide causes for quench. Additionally, since many processes involved in winding the superconducting coil as well as interconnection of the superconducting conductors have to be resorted to human labor, difficulty is often encountered in realizing uniformity in respect to the manufacturing precision. Of course, high precision itself can not easily be achieved. Moreover, the superconducting magnet apparatus as a whole is of a large size and heavy, giving rise to another problem.

SUMMARY OF THE INVENTION

In the light of the state of the art briefed above, it is an object of the present invention to provide superconducting magnet apparatus of an improved structure which can effectively protect the magnetic flux as generated from decreasing while preventing occurrence of quench and which can be implemented in a small size and light weight while ensuring high manufacturing precision or accuracy as well as high uniformity thereof.

Another object of the invention is to provide a method of magnetizing the superconducting magnet apparatus mentioned above.

It is also an object of the present invention to provide a magnetic resonance imaging system in which the superconducting magnet apparatus mentioned above is made use of.

In view of the above and other objects which will become apparent as description proceeds, there is provided according to a general aspect of the invention a superconducting magnet apparatus which includes a cryostat vessel for containing therein a coolant for superconductivity, a magnetic flux generating unit disposed within the cryostat vessel and including a superconducting multilayer composite member constituting a sustaining medium for a sustaining persistent current which generates a magnetic flux along a center axis of a predetermined magnetic field space, and members for holding the magnetic field generating unit within the cryostat vessel.

With the arrangement of the superconducting magnet apparatus described above, a static magnetic field generating source is constituted by the superconducting multilayer composite member which serves as a medium for holding or sustaining the persistent current flowing around a predetermined axis along which the magnetic flux is generated. The static magnetic field generating source made of the superconducting multilayer composite member requires substantially no electric connections. Besides, there exists substantially no possibility of the magnetic field generating source body 13 being subjected to mechanical changes or deformations, as encountered in the case of conventional superconducting coils. Accordingly, the static magnetic field source made of the superconducting multilayer composite member can positively be protected against such unwanted phenomena or events as lowering of the magnetic flux ascribable to connecting resistances making appearance at the electrical connections, quenching due to heat generation which is ascribable to the mechanical deformation and others. Additionally, because the static magnetic field generating source constituted by the superconducting multilayer composite member can be manufactured without need for the winding process and electrically connecting process, which are required for manufacturing the conventional superconducting coil, there can be ensured high precision or accuracy and uniformity as well as high quality. Moreover, by virtue of the structural simplicity of the static magnetic field generating source made of the superconducting multilayer composite member, the superconducting magnet apparatus as a whole can be implemented in a reduced size with light weight when compared with the conventional coil-type static magnetic field generating sources.

The above and other objects, features and attendant advantages of the present invention will more easily be understood by reading the following description of the preferred embodiments thereof taken, only by way of example, in conjunction with the accompanying drawings.

BRIEF DESCRIPTION OF THE DRAWINGS

In the course of the description which follows, reference is made to the drawings, in which:

FIGS. 8A to 8F are diagrams for graphically illustrating a third magnetizing method according to the present invention;

DESCRIPTION OF THE PREFERRED EMBODIMENTS

Figure 1A:
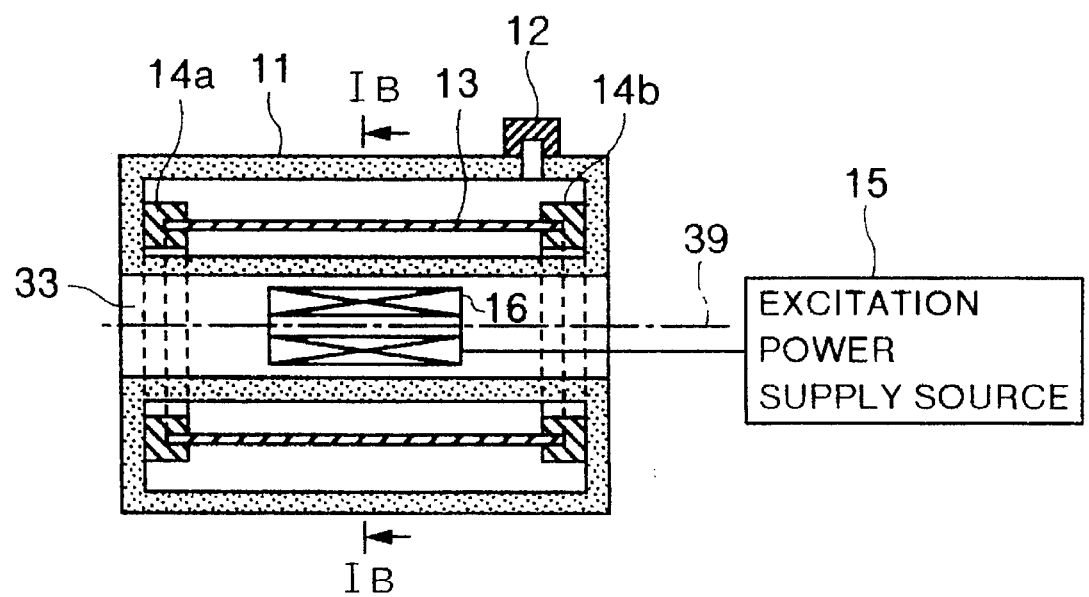
FIG. 1A is a view showing a structure of a superconducting magnet apparatus which includes a cylindrical static magnetic field generating source made of a superconducting multilayer composite member according to an embodiment of the present invention.

Now, the present invention will be described in detail in conjunction with what is presently considered as preferred or typical embodiments thereof by reference to the drawings. In the following description, like reference characters designate like or corresponding parts having equivalent functions throughout the several views. Also in the following description, it is to be understood that such terms as "left", "right", "top", "bottom", "vertical", "horizontal" and the like are words of convenience and are not to be construed as limiting terms.

Figure 1B:
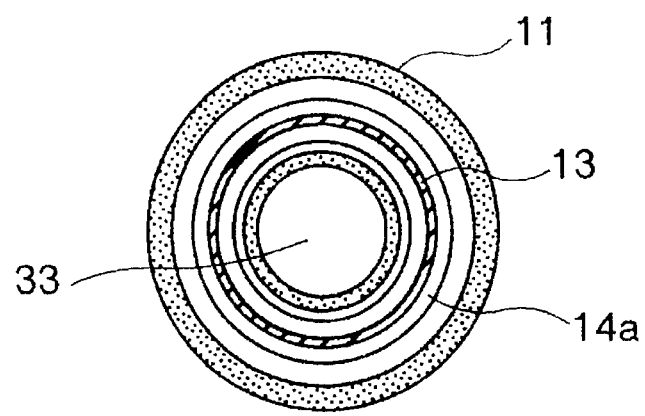
FIG. 1B is a sectional view taken along a line IB—IB shown in FIG. 1A.

FIGS. 1A and 1B show a superconducting magnet apparatus suited for use in a magnetic resonance imaging system according to an embodiment of the present invention, wherein FIG. 1A is a vertical sectional view of the same and FIG. 1B shows schematically a section taken along a line IB—IB in FIG. 1A. In the case of the superconducting magnet apparatus now under consideration, a superconducting multilayer composite member of a cylindrical configuration is employed as a static magnetic field generating source. In the figures, a reference numeral 11 denotes a cryostat vessel having a cylindrical hollow cavity (also referred to as the coolant chamber) which is thermally insulated to and from the exterior, wherein liquid helium used generally as a coolant for realizing superconductivity in the conventional superconducting coil systems is accommodated within the hollow cavity with a coolant injecting port 12 being mounted on the cryostat vessel 11 at a top thereof. Immersed in the coolant accommodated within the cryostat vessel 11 is a cylindrical body 13 made of a superconducting multilayer composite member (hereinafter also referred to as the cylindrical supper conducting multilayer composite member) which serves as a static magnetic field generating source. The cylindrical body 13 is supported by supporting members 14a and 14b at both ends thereof so that the cylindrical superconducting multilayer composite member 13 can be held stationarily at a predetermined position within the cryostat vessel 11. The supporting members 14a and 14b are fixedly secured to the cryostat vessel 11. At this juncture, it should be mentioned that the supporting members 14a and 14b are provided with an appropriate number of through-holes so that the coolant can flow freely through and across the cylindrical body 13, although the through-holes are omitted from illustration. These through-holes will hereinafter be referred to as the coolant flow through-holes. Furthermore, a through-hole 33 is so formed as to extend through the cryostat vessel 11 along the center axis thereof. This through hole 33 is used as a space for accommodating an object for inspection or diagnosis or the like purpose in the case where the superconducting magnet apparatus according to the instant embodiment of the invention is made use of in the magnetic resonance imaging system.

Parenthetically, each of the supporting members 14a and 14b has a thermal expansion coefficient which is substantially equal to or matches with that of the static magnetic flux generating source.

As a preferred one of the superconducting multilayer composite members, there may be mentioned a NbTi/Nb/Cu-superconducting multilayer composite member or sheet having a thickness of about 1 mm which can be manufactured by stacking or laminating NbTi-layers (e.g. 30 layers in number) and Cu-layers (e.g. 31 layers) alternately with each other with Nb-layers (e.g. 60 layers in total) being each interposed between the NbTi-layer and the Cu-layer so that both surfaces of the multilayer member are formed by the Cu-layers, respectively, and subsequently subjecting the multilayer member to a hot rolling or cold rolling. Parenthetically, a composite sheet member manufactured by integrally stacking a plurality of sheets each of about 1 mm in thickness which are obtained by the rolling may equally be used. Through a deep drawing of the NbTi/Nb/Cu-superconducting multilayer composite member or the composite sheet member manufactured in this manner, a cup is formed, whereupon a bottom wall is then cut away, to thereby form the cylindrical body 13 of a superconducting multilayer composite member. For more particulars of the method of manufacturing the NbTi/Nb/Cu-superconducting multilayer composite member mentioned above, reference should be made to "IEEE TRANSACTIONS ON APPLIED SUPERCONDUCTIVITY", VOL 3, NO. 1, (MARCH 1993), PP. 177–180.

In the cylindrical superconducting multilayer composite member 13, a persistent current flows in a circumferential direction. Thus, owing to this persistent current, there is generated or formed a static magnetic field within the inner space defined by the through-hole 33 of the cylindrical body 13.

Figure 2A:
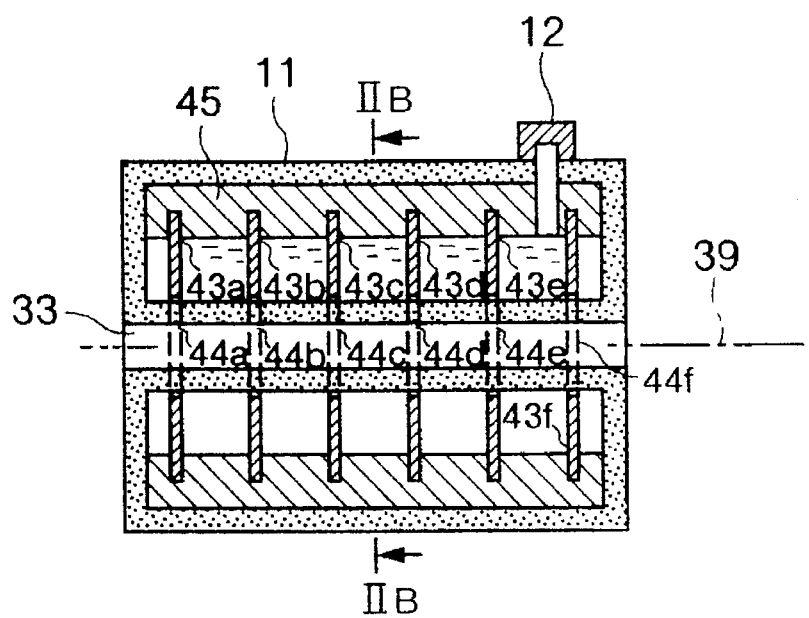
FIG. 2A shows a superconducting magnet apparatus including planar (disk-like) superconducting multilayer composite members as a static magnetic flux density generating source according to another embodiment of the present invention.
Figure 2B:
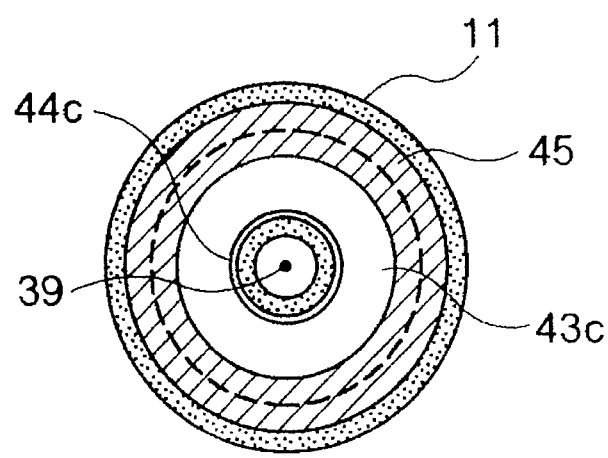
FIG. 2B shows a section of the same taken along a line IIB—IIB in FIG. 2A.

As can be readily be appreciated, the cylindrical superconducting multilayer composite member 13 requires substantially neither electric connections nor contacts. Besides, there is substantially no possibility of the cylindrical body 13 being subjected to mechanical deformation, as encountered in the case of the conventional superconducting coil type magnet apparatus. Accordingly, the cylindrical superconducting multilayer composite member can positively be protected against such unwanted phenomena or events as lowering of the magnetic flux ascribable to connecting resistances of the electrical connections, quenching due to heat generation which is ascribable to the mechanical deformation and others. Additionally, because the cylindrical superconducting multilayer composite member 13 can be formed by the deep drawing and the cutting process without need for wire winding process as well as electrically connecting process which are required for manufacturing the conventional superconducting coil type magnet apparatus, there can be ensured high precision and uniformity as well as high quality for the cylindrical body 13 and hence for the superconducting magnet apparatus. Moreover, by virtue of the structural simplicity of the static magnetic field generating source realized by the superconducting multilayer composite member in the form of a cylinder, the superconducting magnet apparatus as a whole can be implemented in a reduced size with light weight to another great advantage, when compared with the conventional superconducting coil-type static magnetic field generating FIGS. 2A and 2B show a superconducting magnet apparatus according to another embodiment of the present invention, in which FIG. 2A is a vertical sectional view of the same and FIG. 2B shows a section taken along a line IIB—IIB in FIG. 2A. The following description will be made on the assumption that the superconducting magnet apparatus according to the instant embodiment is also designed to be used as a magnet apparatus for a magnetic resonance imaging system. Referring to the figures, the cryostat vessel 11 has a cylindrical hollow cavity which is thermally insulated to and from the exterior and which is adapted to accommodate therein liquid helium employed as a coolant required realizing for the superconductivity, wherein a coolant injecting port 12 is installed on the cryostat vessel 11 at a top thereof. Immersed within the coolant contained in the cryostat vessel 11 are a plurality of disks 43a to 43f each made of a superconducting multilayer composite member, which disks are disposed in juxtaposition to one another and which cooperate to constitute a static magnetic field generating source, wherein flux passage through-holes 44a to 44f are formed in the disks 43a to 43f at center portions thereof, respectively. The disks 43a to 43f each made of the superconducting multilayer composite member (hereinafter also referred to as the disk-like superconducting multilayer composite member) are fixedly secured to a supporting member 45 which is fixedly mounted on the inner wall of the cryostat vessel 11. Incidentally, it should be noted that a through-hole 33 is also formed in the cryostat vessel 11 in such orientation as to extend along the center axis 39 of the cryostat vessel 11, as in the case of the superconducting magnet apparatus shown in FIG. 1A.

As a preferred one of the superconducting multilayer composite members, there may be mentioned a NbTi/Nb/Cu-superconducting multilayer composite member or sheet having a thickness of about 1 mm which can be obtained by laminating NbTi-layers (e.g. 30 layers in number) and Cu-layers (e.g. 31 layers) alternately with each other with Nb-layers (e.g. 60 layers in total) being each interposed between the NbTi-layer and the Cu-layer so that both surfaces of the finished multilayer member are formed by the Cu-layers, respectively, and subsequently subjecting the multilayer member to a hot rolling or cold rolling. Starting from the NbTi/Nb/Cu superconducting multilayer composite sheet thus obtained, there can be manufactured the disk-like superconducting multilayer composite member which have desired shape and size and the flux flow through-holes by resorting to appropriate processings or works.

In each of the disk-like superconducting multilayer composite members 43a to 43f, a persistent current flows around each of the flux flow through-holes 44a to 44f. Consequently, a magnetic flux and hence a magnetic field which passes through the flux flow through-holes 44a to 44f is generated or formed by the persistent current.

In the superconducting magnet apparatus according to the instant embodiment of the invention, the number of the disks 43a to 43f made of the superconducting multilayer composite sheet corresponds to a number of turns of a superconducting coil. Accordingly, by increasing the number of these disks, the intensity or strength of the magnetic field as generated can be increased correspondingly. It is apparent that with the structure of the superconducting magnet apparatus according to the instant embodiment, advantageous effects similar to those of the first embodiment can be obtained.

It should further be mentioned that plate-like or planar superconducting multilayer composite members of various geometric configurations may be employed in place of the disks 43a to 43f which are formed each in a circular shape.

Next, a method of magnetizing the cylindrical superconducting multilayer composite member 13 will be elucidated by reference to FIG. 1A.

For magnetization, a magnetizing coil 16 connected to an excitation power supply source 15 is inserted into the through-hole 33. Refer to FIG. 1A. For magnetizing the cylindrical superconducting multilayer member, there may be conceived three methods (1), (2) and (3), which will be described below.

Magnetizing Method (1)

According to this magnetizing method (1), the cylindrical superconducting multilayer composite member 13 is set from a normal conducting state to a superconducting state, whereon intensity of an external magnetic field applied for the magnetization is gradually lowered to zero in the superconducting state.

Figure 5:
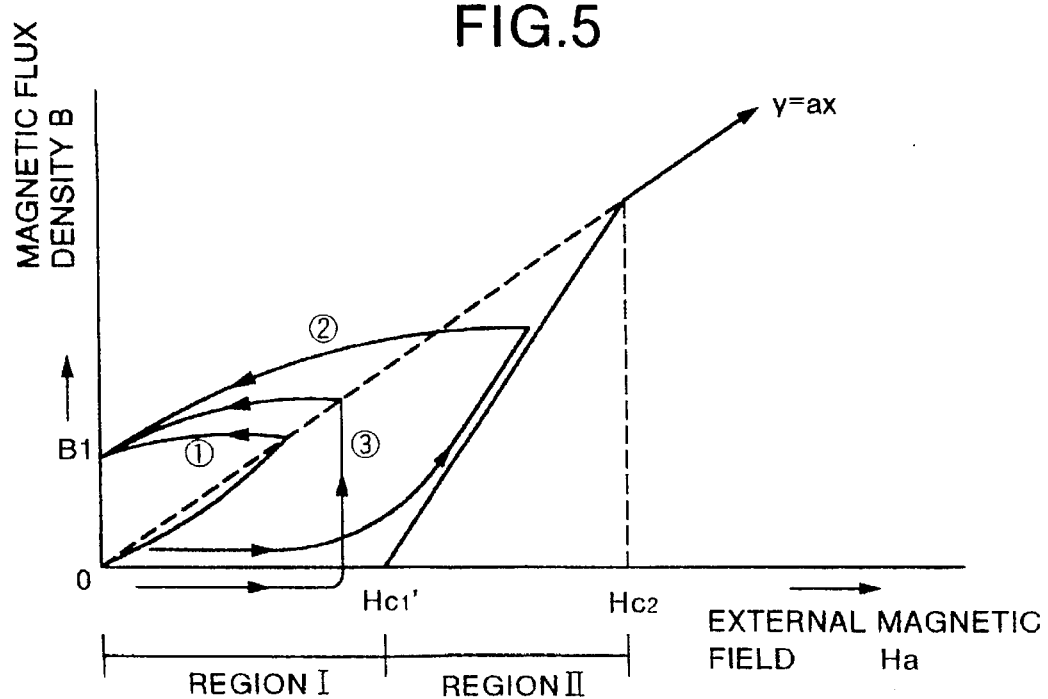
FIG. 5 is a view for graphically illustrating the underlying methods of magnetizing superconducting multilayer composite members.

FIG. 5 shows a relation between an external magnetic field Ha which is applied from one outside of the superconducting multilayer composite member and a magnetic flux density B in the opposite outside of the superconducting multilayer composite member. Referring to the figure, a line y=ax represents a relation between the external magnetic field Ha and the magnetic flux density B in the normal conducting state. Further, reference character $H_{C1}'$ represents an intensity of an external magnetic field which passes through the superconducting multilayer composite member and appears at an opposite side with respect to an applied side while $H_{C2}$ represents an upper critical field intensity. According to the magnetizing method (1) now under consideration, the external magnetic field is applied by resorting to such a process as to follow a path ① shown in FIG. 5, as a result of which a persistent current flows through the cylindrical superconducting multilayer composite member 13 for holding a magnetic flux $B_1$.

Now, referring to FIG. 1A together with FIGS. 6A to 6E, the magnetizing method (1) will be elucidated in more concrete.

At first, the cryostat vessel 11 is evacuated to an empty state. To say in another way, the cylindrical superconducting multilayer composite member 13 is initially held at a temperature which is higher than that for the superconducting state. In this state, an excitation current is supplied to the magnetizing coil 16 from the excitation power supply source 15 (refer to FIG. 6C). The magnetizing coil 16 may be of a solenoid type. When the excitation current flows through the magnetizing coil 16, a magnetic flux of a loop-like distribution which passes through a hollow portion of the magnetizing coil 16 is generated to thereby form an external magnetic field for the magnetization (see FIG. 6D). The loop-like magnetic flux has a loop portion extending through a wall of the cylindrical superconducting multilayer composite member 13 and a loop portion extending externally around the cylindrical member 13 without extending therethrough. At any rate, the loop-like magnetic flux gives rise to generation of an induced current which flows through the cylindrical superconducting multilayer composite member 13 in the circumferential direction thereof for capturing the magnetic flux extending therethrough. However, because the temperature is higher than that required for realizing the superconducting state, the induced current is rapidly attenuated to zero due to a resistance of the cylindrical superconducting multilayer composite member 13 (see FIG. 6B).

Figure 6A:
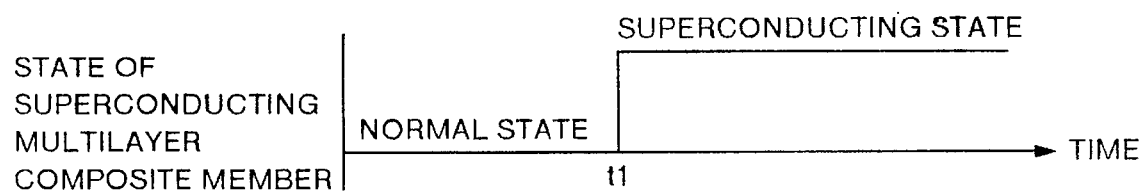
FIGS. 6A to 6E are diagrams for graphically illustrating a first magnetizing method according to the present invention.
Figure 6B:
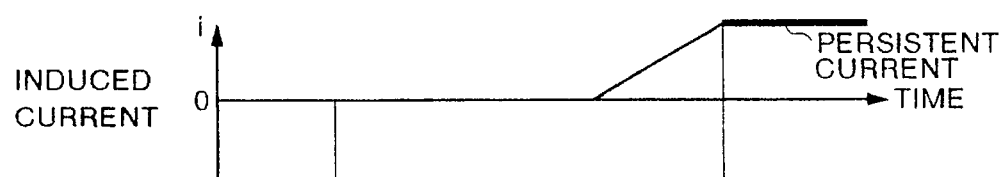
Figure 6C:
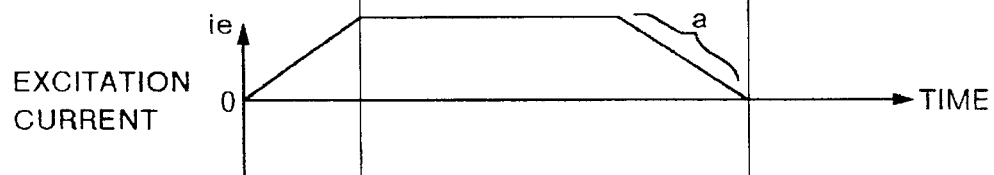
Figure 6D:
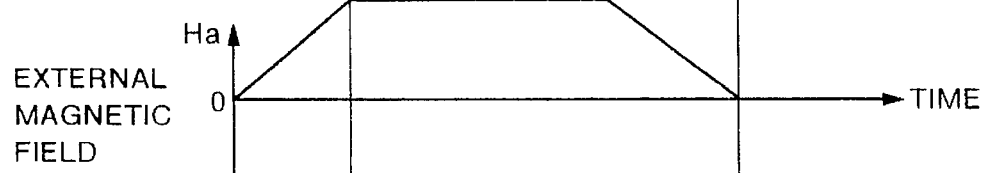
Figure 6E:
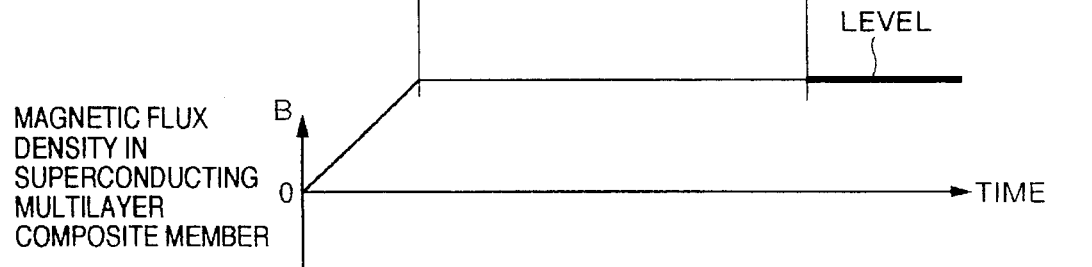

Subsequently, the cryostat vessel 11 is charged with liquid helium serving as the coolant for realizing the superconducting state at a time point $t_1$ shown in FIG. 6A. Thus, the cylindrical body superconducting multilayer composite member 13 is cooled down to the temperature at which the cylindrical superconducting multilayer composite member 13 can assume the superconducting state. Thereafter, the excitation current supplied to the magnetizing coil 16 from the excitation power supply source 15 is gradually decreased ultimately to zero, as indicated by a curve a shown in FIG. 6C. In this manner, there is generated in the cylindrical superconducting multilayer composite member 13 a superconducting current in the direction for holding the magnetic flux in accordance with the superconductivity characteristics of the cylindrical member 13, which current is held or sustained as the persistent current (see FIG. 6B). Thus, a loop-like magnetic flux is generated by the persistent current (refer to FIG. 6E). This magnetic flux loop extends the space 33 along the center axis 39 of the cylindrical member 13, of as a result of which a static magnetic field continues to be generated along the center axis 39. Once the cylindrical superconducting multilayer composite member 13 has been magnetized as a persistent current sustaining or holding medium, the magnetizing coil 16 is removed away from the space 33 which can now be utilized for disposition of an object for inspection whose magnetic resonance image is to be taken.

Magnetizing Method (2)

This method is carried out by following a path ② shown in FIG. 5. Namely, the cylindrical superconducting multilayer composite member 13 is set to the superconducting state and the intensity of the external magnetic field is increased to be fixed at a predetermined level in a region II. After lapse of a predetermined time, the external magnetic field is progressively lowered to zero. This magnetizing method will be elucidated below in more detail by referring to FIG. 1A together with FIGS. 7A to 7E.

Figure 7A:
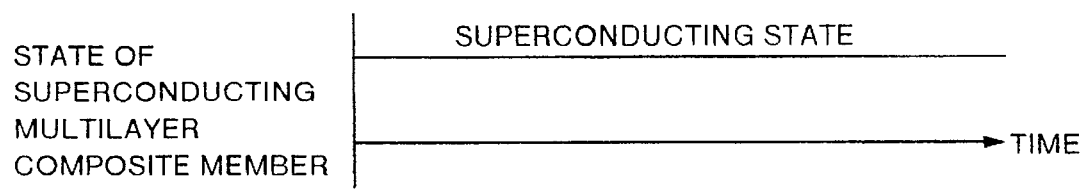
FIGS. 7A to 7E are diagrams for graphically illustrating a second magnetizing method according to the present invention.
Figure 7B:
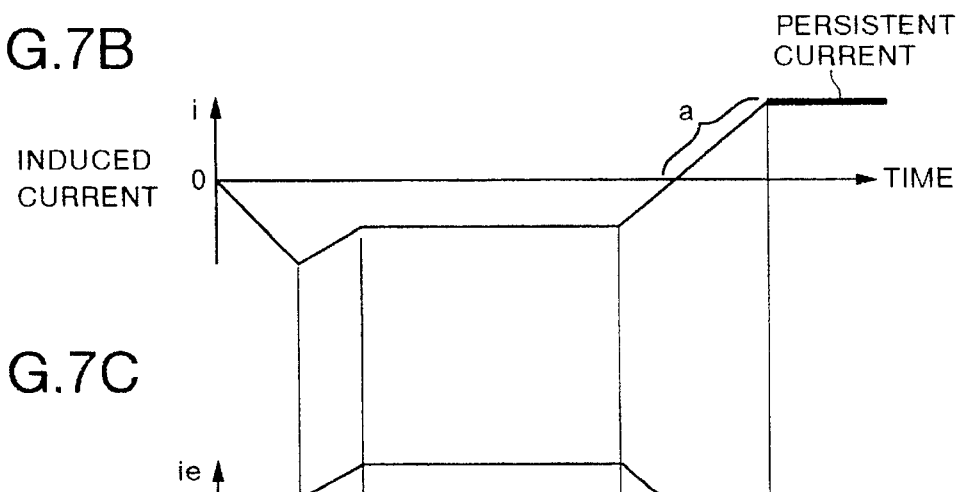
Figure 7C:
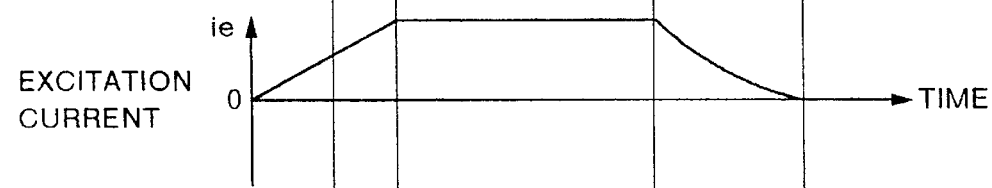
Figure 7D:
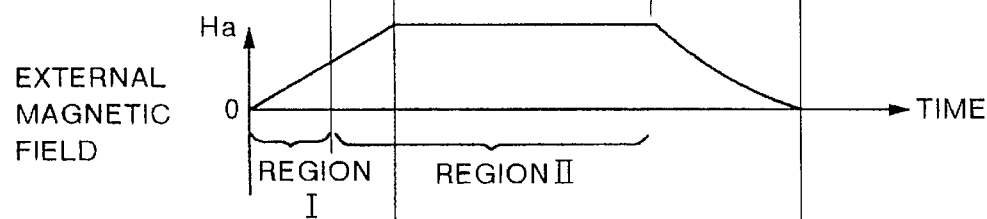
Figure 7E:
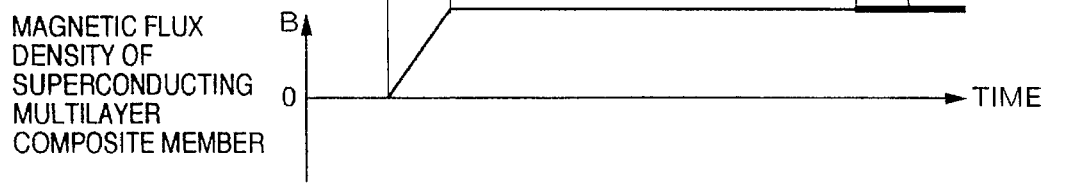

As is illustrated in FIGS. 7A and 7C, when the excitation current flowing through the magnetizing coil 16 is progressively increased while maintaining the cylindrical superconducting multilayer composite member 13 at a temperature at which it assumes the superconducting state, the magnetizing flux generated by the magnetizing coil 16 and extending through the space 33 is increased to thereby form the external magnetic field for the magnetization, as a result of which a current flowing circumferentially through the cylindrical superconducting multilayer composite member 13 is induced in the direction inhibiting the current from increasing in accordance with the superconductivity characteristics of the cylindrical superconducting multilayer composite member 13 (refer to FIG. 7B). When the current flowing through the magnetizing coil 16 has attained a predetermined level at which an external magnetic field of the intensity exceeding the intensity $H_{C1}'$, the current is sustained as it is during a predetermined period. Namely, when the magnetizing magnetic flux passing through the space 33 and hence the current induced in the cylindrical superconducting multilayer composite member 13 in the circumferential direction have reached the respective predetermined levels, they are sustained at these levels, respectively. Subsequently, when the current flowing through the magnetizing coil 16 is gradually decreased to zero, as illustrated in FIG. 7C, there is induced in the cylindrical superconducting multilayer composite member 13 in accordance with the superconductivity characteristics thereof a current which flows in a circumferential direction opposite to that of the current induced when the magnetic flux is increased, whereby the induced current flowing in the circumferential direction mentioned above is held as the persistent current of a certain level even when the current flowing through the magnetizing coil becomes zero, as indicated by a curve asin FIG. 7B. In this way, a magnetizing level illustrated in FIG. 7E can be realized by the persistent current.

Magnetizing Method (3)

This magnetizing method is carried out by following a path or route ③ shown in FIG. 5. In the region I, the cylindrical superconducting multilayer composite member 13 is heated to set it only temporarily to a normal state. Subsequently, the cylindrical superconducting multilayer composite member 13 is again set to the superconducting state and the external magnetic field intensity is gradually lowered.

This magnetizing method will be elucidated below in more concrete by referring to FIG. 1A together with FIGS. 8A to 8F. By maintaining the cylindrical superconducting multilayer composite member 13 in the superconducting state, the excitation current supplied to the magnetizing coil 16 is progressively increased, to thereby set the intensity of the external magnetic field at a predetermined value smaller than the magnetic field intensity $H_{C1}'$. Subsequently, in this state, the cylindrical superconducting multilayer composite member 13 is heated by using a heater incorporated internally to thereby set the cylindrical superconducting multilayer composite member 13 to the normal state (see FIGS. 8A and 8F). Thus, there is established the state in which the external magnetic field can freely pass through the interior of the cylindrical superconducting multilayer composite member 13. Thereafter, the heater mentioned above is turned off to thereby allow the cylindrical superconducting multilayer composite member 13 to resume the superconducting state. In this state, the excitation current is decreased to thereby lower gradually the intensity of the external magnetic field (see FIGS. 8C and 8D). In the course of this process, there is generated an induced current which is effective to hold the magnetic flux passing through the interior of the cylindrical superconducting multilayer composite member 13 (see FIG. 8B). This induced current becomes the persistent current, whereby the magnetization level illustrated in FIG. 8E can be realized.

Figure 3:
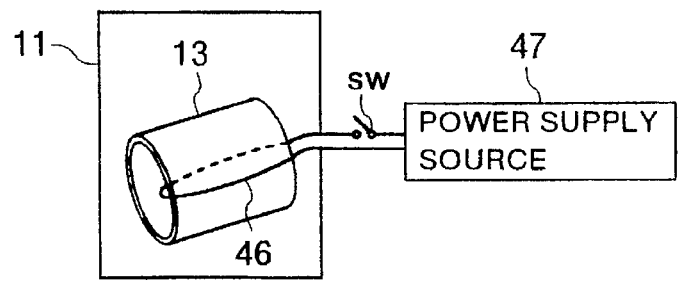
FIG. 3 is a schematic diagram for illustrating an exemplary arrangement for heating the cylindrical superconducting multilayer composite member shown in FIG. 1A by using an electric heater.
Figure 4:
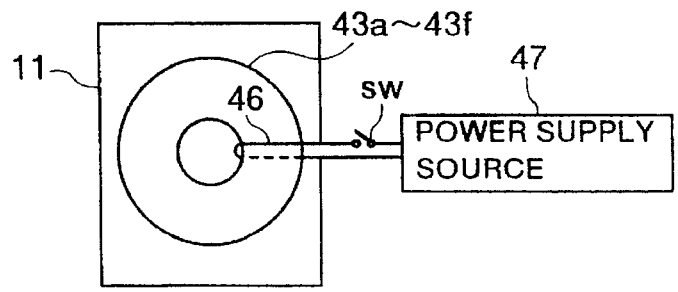
FIG. 4 is a schematic diagram for illustrating an arrangement for heating a disk-like superconducting multilayer composite member shown in FIG. 2A.

FIGS. 3 and 4 illustrate, by way of example, installations of the heater mentioned above. More specifically, FIG. 3 illustrates an arrangement in which the cylindrical superconducting multilayer composite member 13 shown in FIG. 1A is heated by a heater 46 which is so disposed that a wall portion of the cylindrical superconducting multilayer composite member 13 is enclosed by the heater 46 connected to a power supply source 47 via a switch SW provided externally.

On the other hand, in the case of the arrangement illustrated in FIG. 4, the heaters 46 are installed to sandwich each of the disks 43a to 43f shown in FIG. 2A. Other structural arrangement is essentially same as that shown in FIG. 3.

Figure 9:
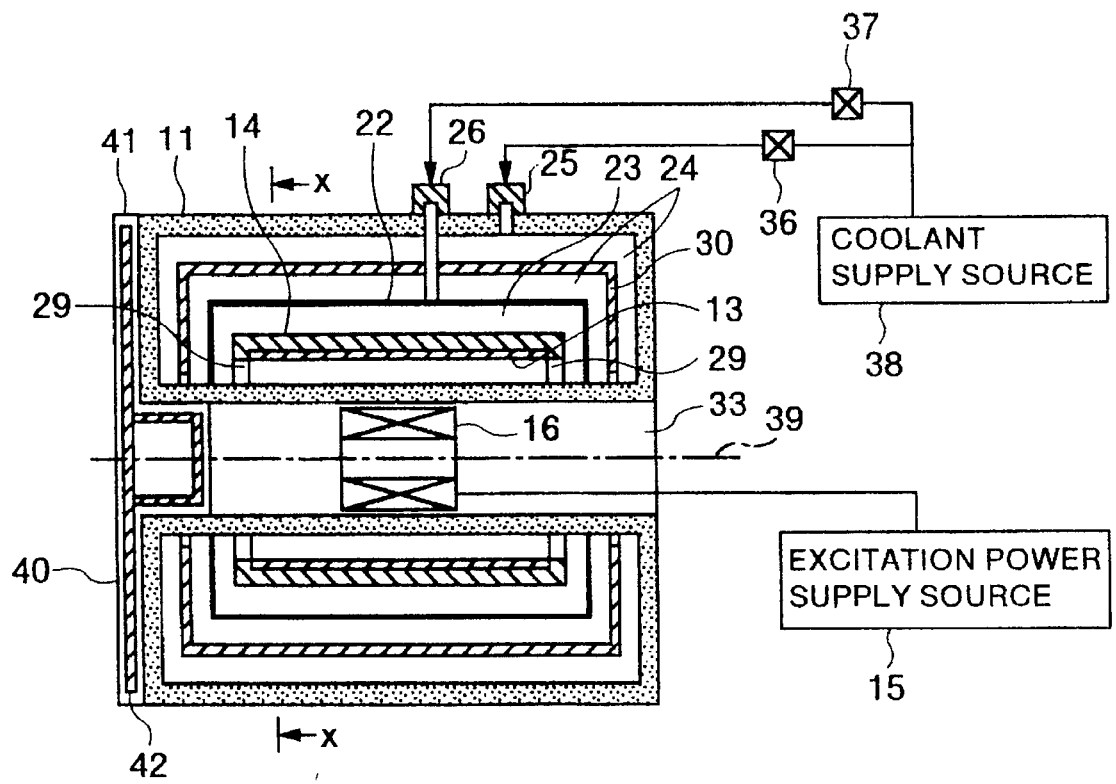
FIG. 9 is a view showing a configuration of a superconducting magnet apparatus which is provided with a magnetic shield according to another embodiment of the present invention.
Figure 10:
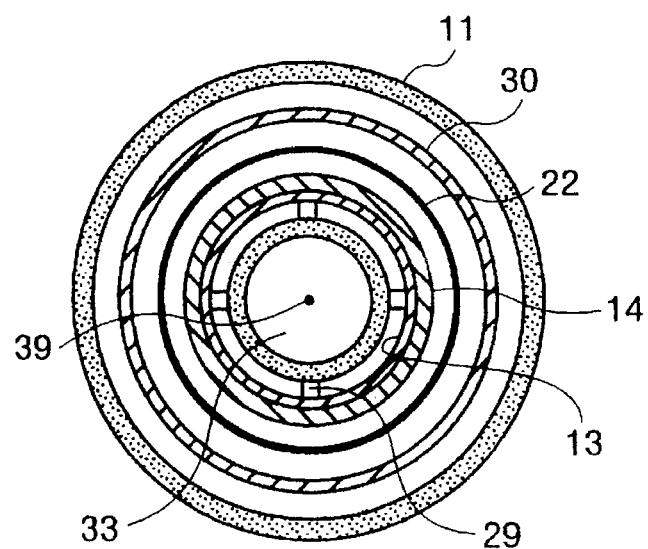
FIG. 10 is a sectional view of the superconducting magnet apparatus taken along a line X—X in FIG. 9.
Figure 11:
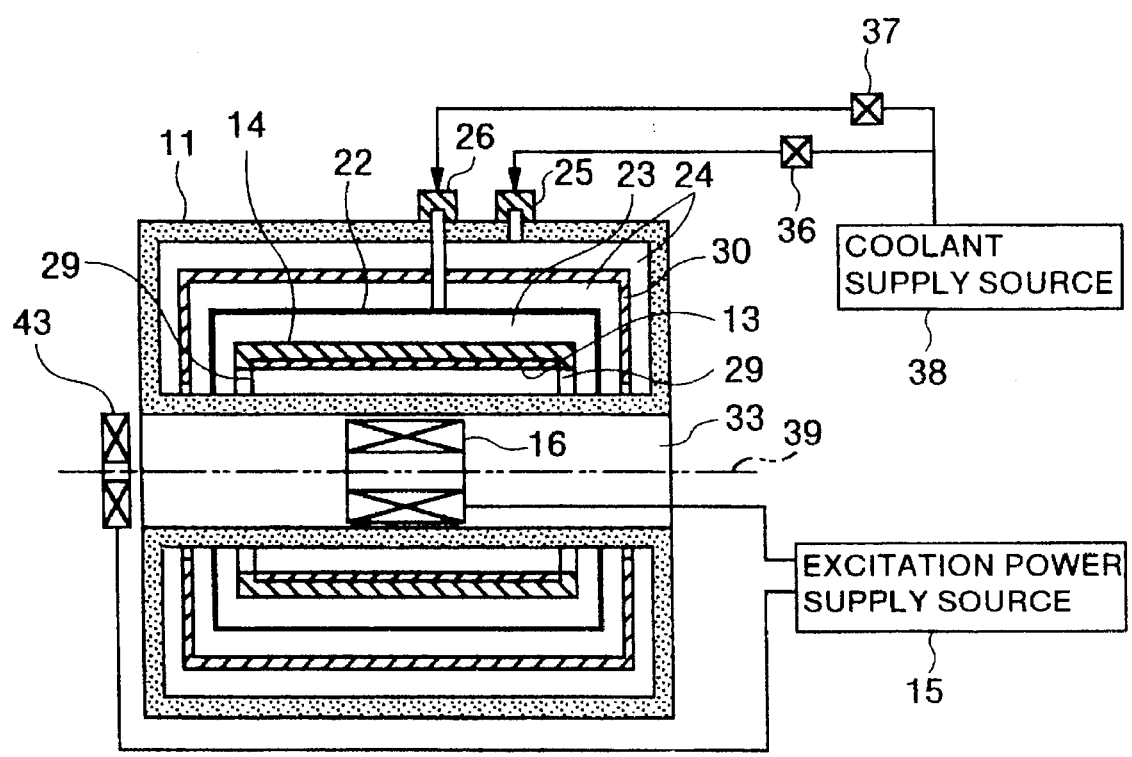
FIG. 11 is a view for illustrating a magnetizing method for magnetizing a superconducting magnet apparatus based on an active magnetic shield method according to another embodiment of the invention.

FIGS. 9 and 11 show a superconducting magnet apparatus according to another embodiment of the present invention which is provided with a magnetic shield, wherein FIG. 10 is a sectional view of the same taken along a line X—X in FIG. 9.

Referring to these figures, a reference numeral 11 denotes a cryostat vessel which is thermally insulated to and from the exterior and which is divided into two coolant chambers 23 and 24 by a partition 22. There is contained in both the coolant chambers 23 and 24 liquid helium serving as a coolant for realizing the superconductivity. Further, coolant injecting ports 25 and 26 are provided in association with the coolant chambers 23 and 24, respectively, for injecting the liquid helium therein. Disposed within the coolant chamber 23 is a cylindrical superconducting multilayer composite member 13 which serves as or constitutes the static magnetic field generating source. The cylindrical superconducting multilayer composite member 13 is supported by means of supporting members 14 which are fixedly secured to the cryostat vessel 11 and has an appropriate number of coolant flow through-holes 29 so that liquid helium can freely flow therethrough. Disposed within the coolant chamber 24 is a circular box-like body 30 made of a superconducting multilayer composite member serving as the magnetic shield so as to cover the cylindrical superconducting multilayer composite member 13. The circular box-like body 30 is fixedly secured to the cryostat vessel 11 so that the coolant can flow through the circular box-like body 30.

Disposed within the inner space 33 of the cylindrical superconducting multilayer composite member 13 serving as the static magnetic field generating source is the magnetizing coil 16 of the solenoid type which is connected to the excitation power supply source 15. A flux impeding member 40 is provided at one end (left end as viewed in the figure) of an axis 39 of the space 33. The flux impeding member 40 is constituted by a container 41 filled with liquid helium serving as the coolant for realizing superconductivity and a superconducting multilayer composite member 42 immersed therein. As the superconducting multilayer composite member 42, a NbTi/Nb/Cu-superconducting multilayer composite member can be employed as in the case of the cylindrical superconducting multilayer composite member 13 and the circular box-like body 30, as described hereinbefore.

The flux impeding member 40 is employed from the first stage of magnetization for the cylindrical superconducting multilayer composite member 13 and removed upon completion of the magnetization.

On the other hand, the coolant injecting ports 25 and 26 are connected to a coolant supply source 38 by way of valves 36 and 37, respectively. By removing caps of the coolant injecting ports 25 and 26 and opening the valves 36 and 37, liquid helium serving as the coolant for superconductivity is poured into the coolant chambers 23 and 24, respectively.

At the magnetization, at first, coolant chamber 24 is filled with liquid helium while keeping coolant chamber 23 empty, so that the circular box-like body 30 is kept in the superconducting state. Then the cylindrical superconducting multilayer composite member 13 is magnetized according to one of the magnetizing methods (1), (2) and (3).

Since the circular box-like body 30 functions as a magnetic shield in the state where the circular box-like body 30 is maintained at a temperature for establishing the superconducting state, the magnetic flux or magnetic field which is generated by the cylindrical superconducting multilayer composite member 13 and which tends to leak outwardly is shielded by the circular box-like body 30. In addition, the magnetic flux generated by the magnetizing coil 16 and extending toward an end (left side as viewed in the figure) of the space 33 along the axis 39 is forced backwardly to the magnetic shield 30 without leaking outwardly. This is because the flux impeding member 40 is constituted by the container 41 filled with liquid helium and the superconducting multilayer composite member 42 disposed within the container 41 and because the superconducting multilayer composite member 42 functions as the magnetic shield. By virtue of this arrangement, the efficiency of magnetization of the cylindrical superconducting multilayer composite member 13 under the magnetic flux generated by the magnetizing coil 16 can significantly be enhanced.

FIG. 11 shows another exemplary embodiment of the superconducting multilayer composite member magnetizing apparatus for illustrating a magnetizing method based on the concept of the present invention. The apparatus shown in this figure differs from that shown in FIG. 9 in that the flux impeding member 40 is constituted by a coil 43 connected to the excitation power supply source 15 and adapted to generate magnetic flux in a direction which is opposite to the direction of the magnetic flux traveling or extending within the space 33. When a current is supplied to the coil 43 from the excitation power supply source 15, the coil 43 generates magnetic flux of the direction opposite to that of the loop-like magnetic flux generated by the magnetizing coil 16, wherein the magnetic flux generated by the coil 43 functions to push backwardly the magnetic flux tending to extend toward the end (left side as viewed in the figure) of the space 33 along the axis 39. Thus, with the arrangement shown in FIG. 11, the efficiency of magnetization of the cylindrical superconducting multilayer composite member 13 can be enhanced as well.

FIGS. 12, 13, 14 and 15 show further exemplary embodiments of the superconducting magnet apparatuses each of which adopts a superconducting multilayer composite member for generating a static magnetic field in the vertical direction.

Figure 12:
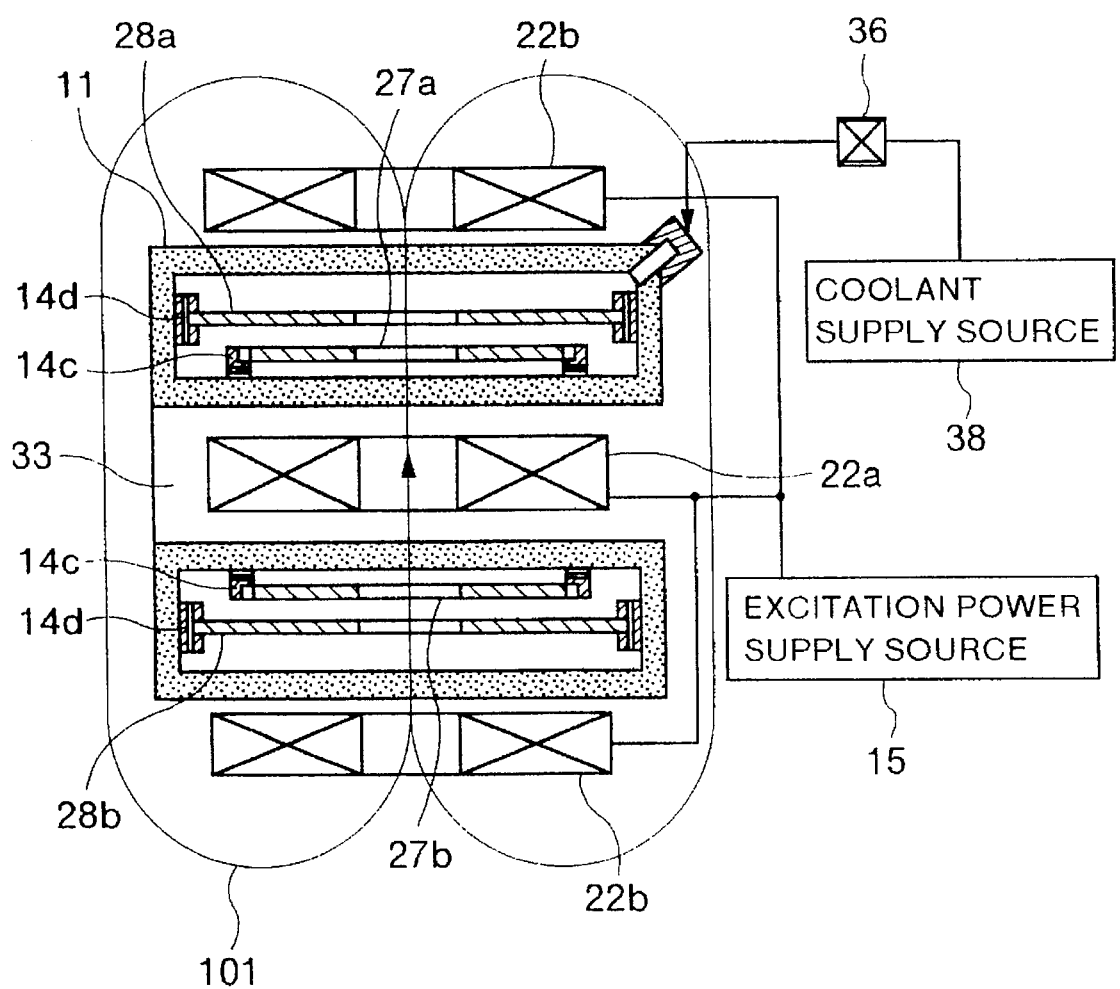
FIG. 12 is a view showing a structure of a vertical magnetic field generating type superconducting magnet apparatus according to yet another embodiment of the present invention.
Figure 13:
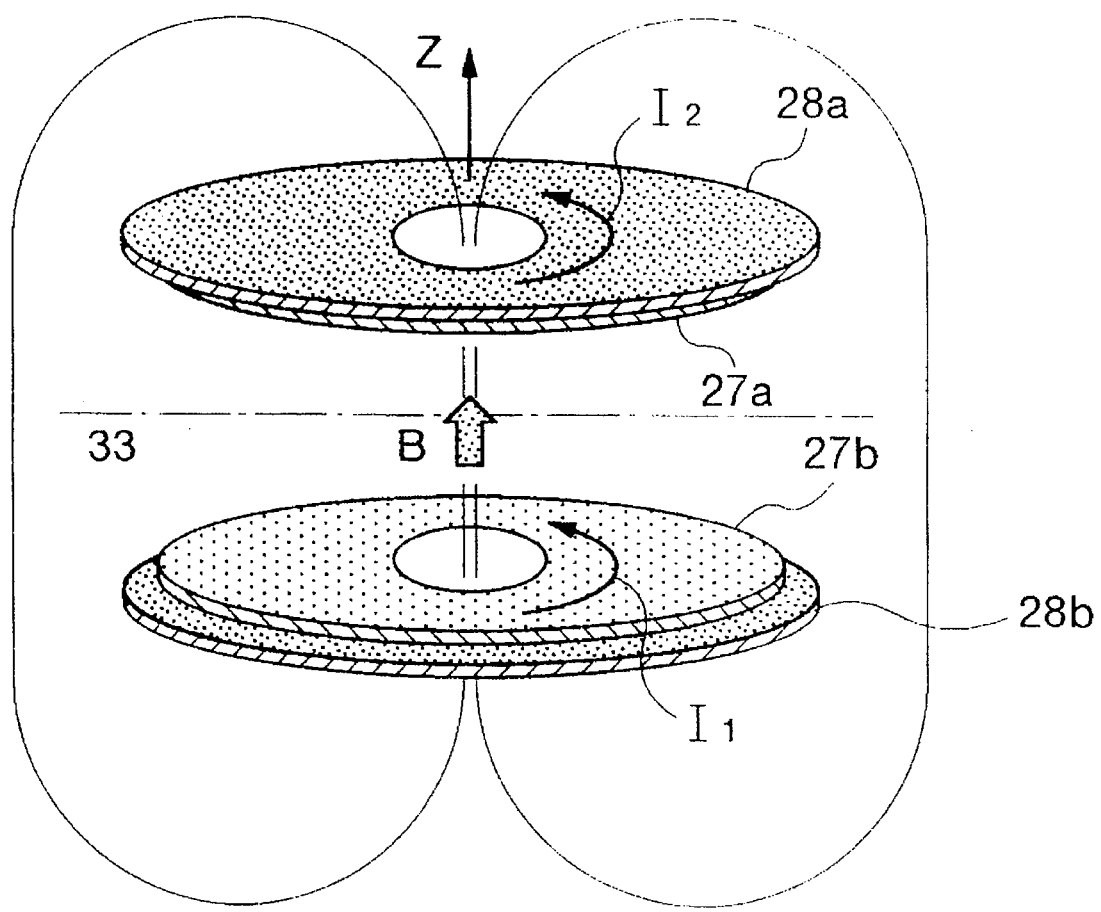
FIG. 13 is a schematic view showing another structure of a superconducting magnet apparatus according to still another embodiment of the present invention.

In FIG. 12, a reference numeral 11 denotes a cryostat vessel thermally insulated to and from the exterior and filled with liquid helium used as a coolant for realizing superconductivity. The cryostat vessel 11 is implemented in a squarish C-like configuration, wherein upper and lower vessel portions are communicated with each other by way of a bridge vessel portion disposed at a rear side corresponding to the plane of the drawing, as viewed in FIG. 12. Within flat inner portions of the cryostat vessel 11, there are disposed static magnetic field generating sources 27a and 27b as well as static magnetic field generating sources 28a and 28b each of which is implemented in a disk-like superconducting multilayer composite member, as shown in FIG. 13. The static magnetic field generating sources 27a and 27b supported by supporting member 14c on one hand and the static magnetic field generating sources 28a and 28b supported by supporting member 14d on the other hand are disposed in opposition to each other with interposition of an outer space 33 disposed therebetween. Reference characters 22a and 22b designate magnetizing coils which are removed after magnetization of the static magnetic field generating sources mentioned above. Magnetic fluxes B generated by persistent currents $I_1$ and $I_2$ flowing through the static magnetic field generating sources 27a, 27b; 28a, 28b, respectively, form flux paths extending through the space 33, center apertures of the static magnetic field generating sources 27a and 28a, center apertures of the static magnetic field generating sources 27b and 28b and the space 33 (refer to FIG. 13). Thus, there is formed within the space 33 a static magnetic field in the vertical direction (as viewed in FIG. 12). Parenthetically, the space 33 is utilized as a space for accommodating therein an object for inspection whose image is to be picked up by an magnetic resonance imaging system incorporating the superconducting magnet apparatus under consideration.

Although two pairs of the disks or pancakes each formed of the superconducting multilayer composite member are employed in the case of the illustrated apparatus, the invention is never restricted to any particular number of the disks. There are conceivable such structures in which two or more disks or pancakes made of the superconducting multilayer composite member are vertically arrayed with a predetermined distance therebetween.

Next, description will turn to a magnetizing method.

The magnetizing coils 22a and 22b are connected to the excitation power supply source 15 so that they have respective polarities in a same direction. As a result, there are generated magnetic fields 101 such as illustrated in FIG. 12.

On the other hand, the coolant is injected into the cryostat vessel 11 though the valve 36 and the coolant injecting port of the cryostat vessel 11 from coolant supply source 38.

The magnetization can be carried out according to a given one of the three magnetizing methods (1), (2) and (3) described previously.

Figure 14:
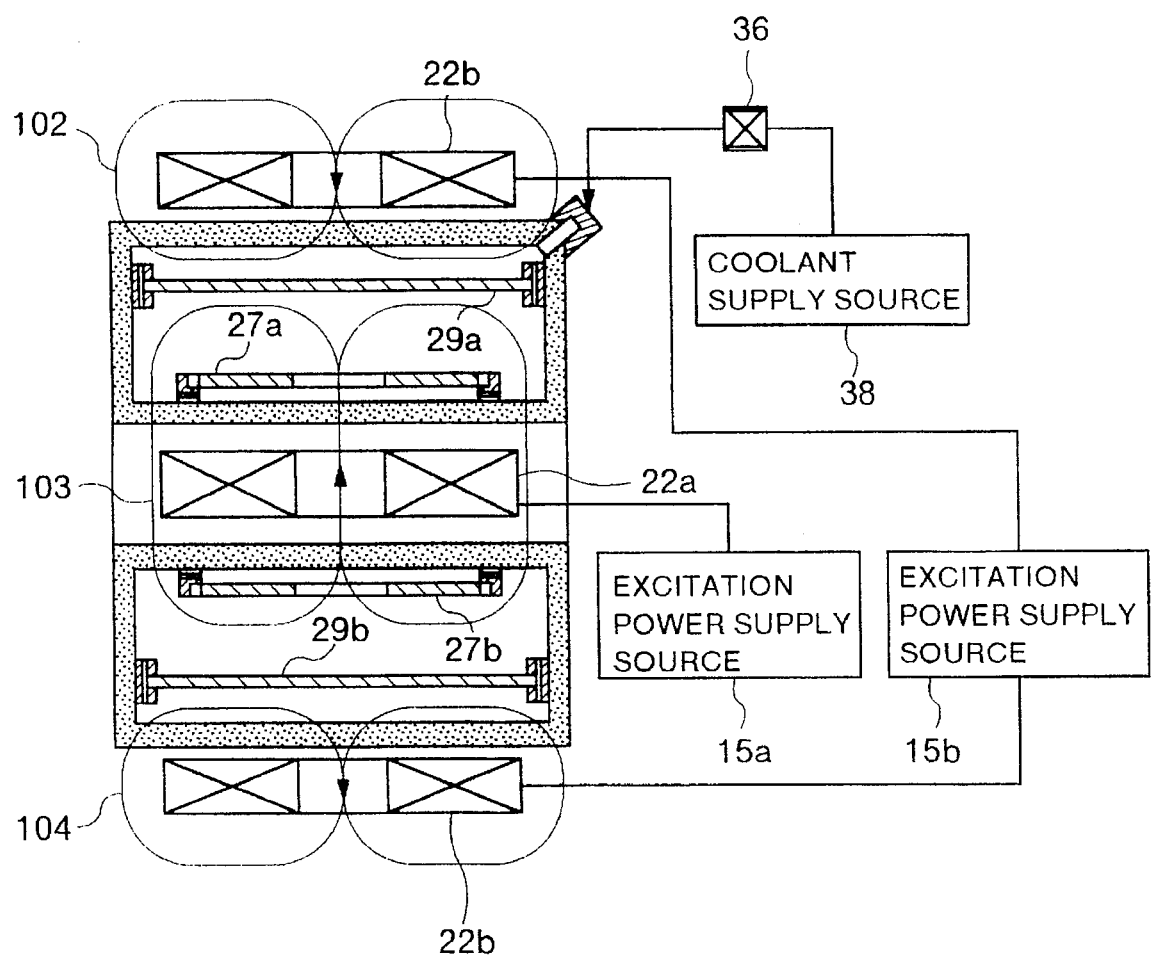
FIG. 14 is a view showing a structure of a vertical magnetic flux density generating type superconducting magnet apparatus provided with a magnetic shield according to a further embodiment of the invention.
Figure 15:
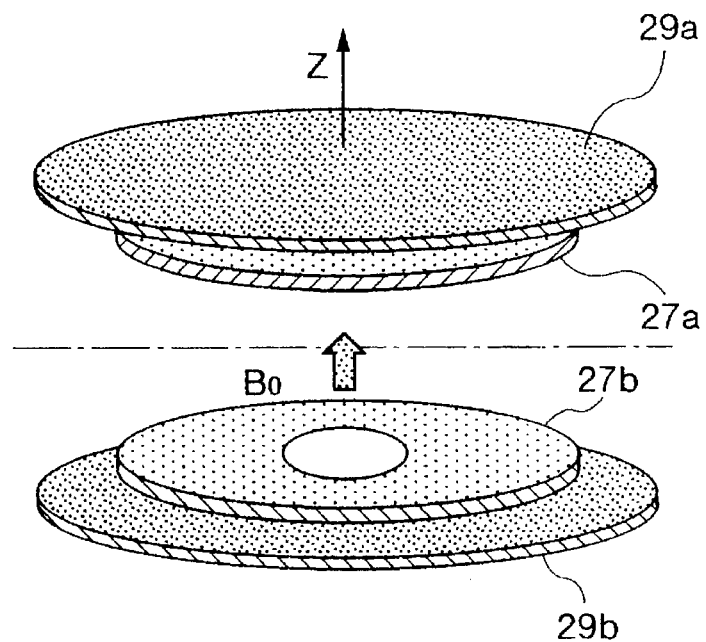
FIG. 15 is a view showing a relation between a superconducting multilayer composite member serving as a static magnetic field generating source and a magnetic shield in the apparatus shown in FIG. 14.

The superconducting magnet apparatus shown in FIGS. 14 and 15 differ from the apparatus described above by reference to FIGS. 12 and 13 in respect that active magnetic shields 29a and 29b are provided in place of the static magnetic field generating sources 28a and 28b. Although a relative large opening or aperture is formed in each of the static magnetic field generating sources 27a and 27b, no opening is present in the active magnetic shields 29a and 29b. From the standpoint of the magnetic shield, the diameters of the active magnetic shields 29a and 29b should preferably be selected to be greater than the diameter of the static magnetic field generating sources 27a and 27b as shown in FIG. 15.

Description will now be made of a magnetizing method for the superconducting magnet apparatus of the structure shown in FIG. 14.

In FIG. 14, reference character 22a denotes a magnetizing coil for magnetizing the static magnetic field generating sources 27a and 27b. The magnetizing coil 22a is connected to a magnetizing power supply source 15a. Further, two magnetizing coils 22b are connected to an excitation power supply source 15b. However, the polarity of the magnetizing coil 22b is in opposition to that of the magnetizing coil 22a. As a result, there are generated magnetic fields 102, 103 and 104 in such directions as illustrated in FIG. 14.

With the arrangement described above, the magnetization is effectuated by performing adjustment such that a predetermined magnetic field intensity or strength can be realized by the excitation power supply sources 15a and 15b while at the same time the magnetic shield can effectively be validated by the active magnetic shields 29a and 29b.

The magnetizing method may be selected from the three magnetizing methods (1), (2) and (3) described hereinbefore.

In the case of the embodiments described above by reference to FIGS. 12 to 15, the disks each made of superconducting multilayer composite sheet are employed as the static magnetic field generating source. It should however be mentioned that the cylindrical superconducting multilayer composite member may equally be employed substantially to the same advantageous effects.

Figure 16:
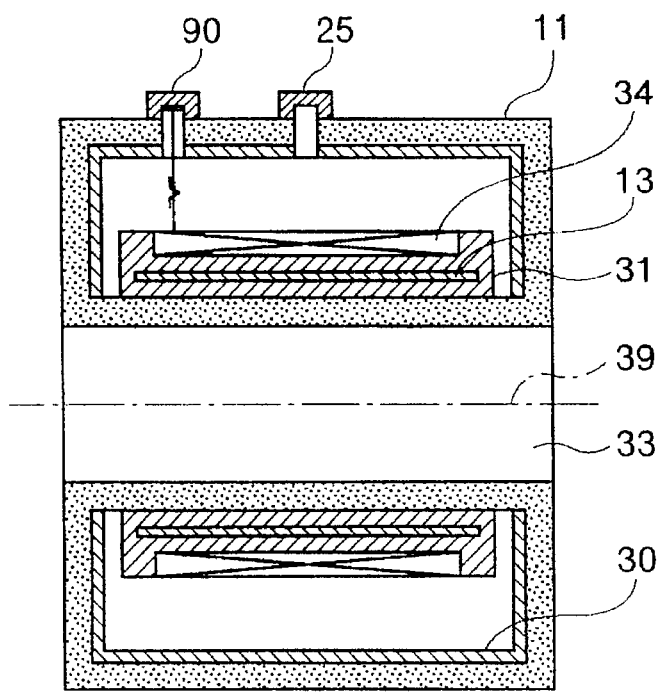
FIG. 16 is a sectional view showing a superconducting magnet apparatus incorporating a magnetizing coil accommodated within a cryostat vessel according to still further embodiment of the invention.

FIG. 16 shows a superconducting magnet apparatus incorporating a magnetizing coil according to another embodiment of the present invention. In the figure, components serving for functions same as or equivalent to those described previously are denoted by like reference characters.

Referring to FIG. 16, a cylindrical static magnetic field generating source 13 constituted a superconducting multilayer composite member is disposed within the cryostat vessel 11 around the center axis 39 of the center throughhole 33 formed in the cryostat vessel 11 and embedded in a bobbin 31 fixedly secured to the cryostat vessel 11. An excitation coil 34 of solenoid type for magnetizing the cylindrical static magnetic field generating source 13 made of a superconducting multilayer composite member is disposed within the cryostat vessel 11 and supported by the bobbin 31. Thus, the cylindrical static magnetic field generating source 13 made of a superconducting multilayer composite member and the excitation coil 34 are implemented in a virtually integral structure. Parenthetically, the bobbin 31 may be made of a glass fiber reinforced plastic (FRP) material.

A magnetic shield 30 also made of a superconducting multilayer composite sheet is disposed in intimate contact with inner wall of the cryostat vessel 11 such that the magnetic shield 30 covers the cylindrical static magnetic field generating source 13 and the excitation coil 34 at sides opposite to the axis with reference to the static magnetic field generating source 13.

Mounted at the top of the cryostat vessel 11 are a coolant injecting port 25 and a current supply connector portion 90 for supplying a current to the magnetizing coil 34.

Incidentally, the magnetic shield 30 may be spared. Further, such a structure can equally be adopted in which the cryostat vessel is partitioned into two compartments, wherein only the magnetic shield is cooled independently. In that case, the structure of the superconducting magnet apparatus will bear similarity to that of the apparatus shown in FIG. 9.

In the structures shown in FIGS. 12 and 14 in which the magnetizing coil is to be incorporated, the magnetizing coil may be disposed at the outside of the superconducting multilayer composite members 27a and 27b.

The magnetizing method may arbitrarily be selected from the methods (1), (2) and (3) described previously.

Figure 17:
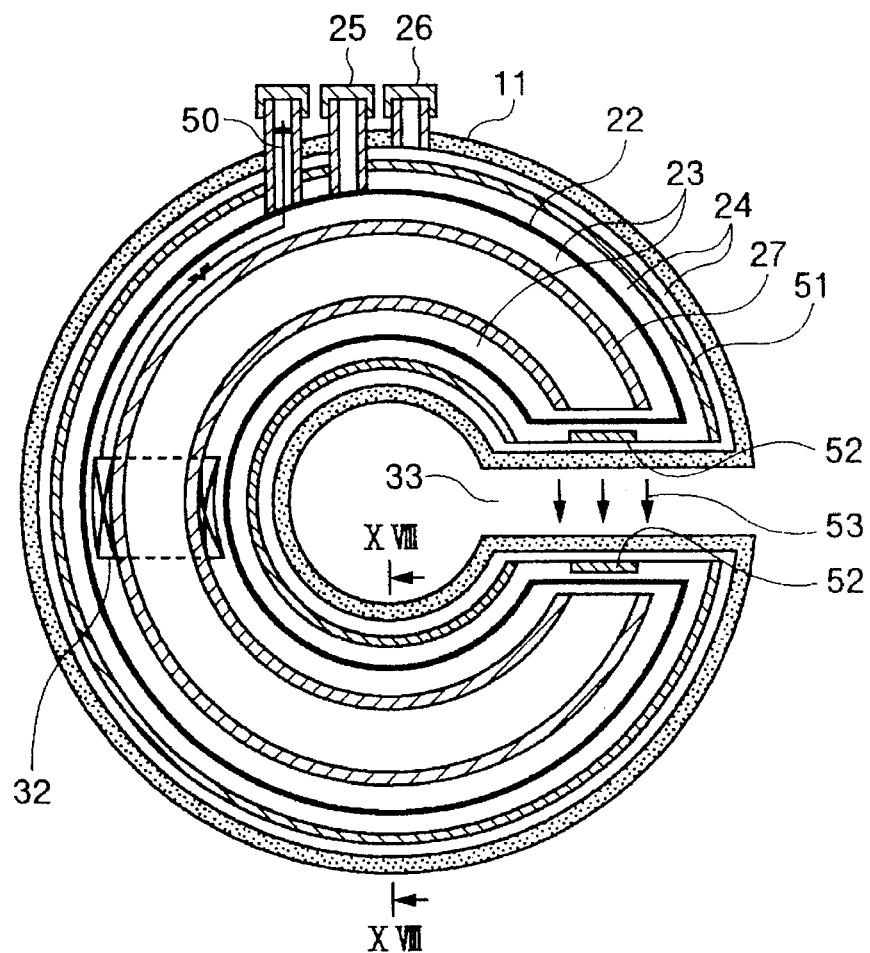
FIG. 17 is a sectional view showing a superconducting magnet apparatus constituted by bending a tubular superconducting multilayer composite member substantially in a C-like shape according to yet another embodiment of the invention.

FIG. 17 shows a superconducting magnet apparatus which is constituted by bending a large-diameter tube of a superconducting multilayer composite member in a C-like shape according to yet another embodiment of the present invention. In the figure, components having the functions identical with or equivalent to those described hereinbefore are designated by like reference characters.

Figure 19:
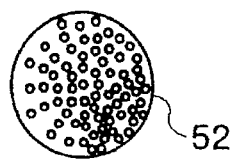
FIG. 19 is a view showing a structure of a shim employed for realizing a uniform magnetic flux distribution according to an embodiment of the invention.

Referring to the figure, the cryostat vessel 11 thermally insulated to and from the exterior has a C-like section, wherein the cryostat vessel 11 is divided or separated into two coolant chambers 23 and 24 by a partition 22 having both ends closed. In association with the coolant chambers 23 and 24, there are provided coolant injecting ports 25 and 26 for introducing liquid helium into the coolant chambers 23 and 24, respectively. Disposed within the coolant chamber 23 is the tubular static magnetic field generating source 27 implemented in a superconducting multilayer composite structure and having a C-like vertical section. Both end portions of the tubular static magnetic field generating source 27 are positioned in opposition to each other with interposition of an external space 33 opened therebetween. Further, one or plural magnetizing coils 32 are wound around the outer peripheral surface of the tubular static magnetic field generating source 27 or inside of the tubular member 27 in the form of a solenoid coil. A reference numeral 50 denotes a current supply terminal for the magnetizing coil 32. Disposed within the coolant chamber 24 is a magnetic shield 51 made of a superconducting multilayer composite member and having a C-like vertical section so as to surround the outer periphery of the tubular static magnetic field generating source 27. Further disposed within the coolant chamber 24 are disk-like shims 52 made of a superconducting multilayer composite member in the vicinity of both ends of the tubular static magnetic field generating source 27, respectively, wherein each of the disk-like shims 52 has at least one magnetic flux passage throughhole, as can be seen in FIG. 19. The magnetic flux generated by the tubular static magnetic field generating source 27 extends through the space 33, as indicated by magnetic flux lines 53, to thereby form a static magnetic field within the space 33 which is used as a place for accommodating an object for inspection or diagnosis whose image is to be picked up by a magnetic resonance imaging system which incorporates the superconducting magnet apparatus. In more concrete, an object under inspection or diagnosis is laid on a table which can be moved from the right to the left or in directions perpendicular to the place of the drawing, whereby the object under inspection is positioned within the space 33.

It should further be mentioned that the superconducting multilayer composite members used in the embodiment of FIG. 17 may be implemented same as or similar to the cylindrical body 13 shown in FIG. 1.

Figure 18:
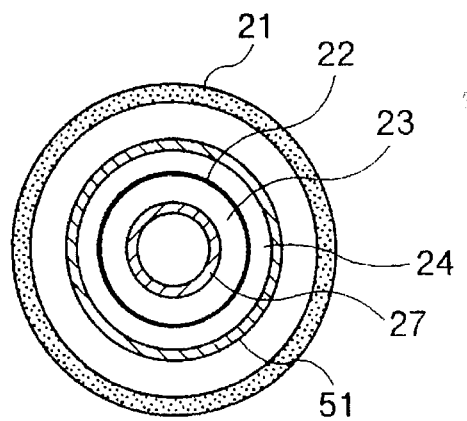
FIG. 18 is a sectional view of the same taken along a line XVIII—XVIII in FIG. 17.

FIG. 18 is a sectional view taken along a line XVIII—XVIII in FIG. 17.

Description will now turn to the disk-like shim 52 shown in FIG. 19.

In general, in the tubular static magnetic field generating source 27, a greater proportion of the magnetic flux will follow inner paths than outer paths even internally of the tubular static magnetic field generating source 27. Accordingly, a correspondingly nonuniform magnetic flux distribution will prevail within the space 33. The disk-like shim 52 is provided for correcting the nonuniform magnetic flux to thereby obtain a uniform magnetic flux distribution. To this end, the disk-like shim 52 may be formed with a small number of holes or holes of a smaller diameter in a portion around the inner periphery of the shim 52 while a large number of through-holes or holes of a large diameter may be formed in an outer peripheral portion. Of course, the shape of the through-holes is not restricted to the circular one.

Magnetization effected by using the excitation coil 32 may be carried out according to a given one of the three magnetizing methods (1), (2) and (3) described hereinbefore.

Figure 20:
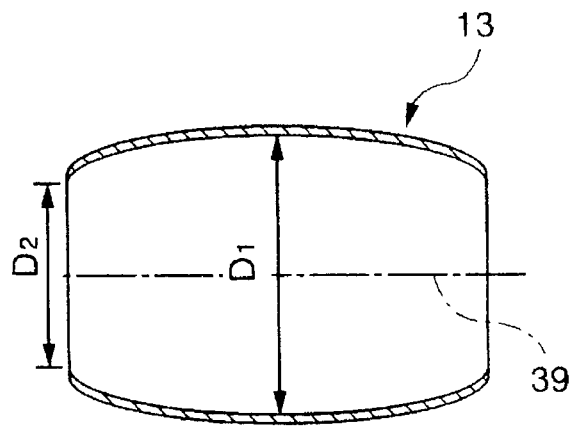
FIG. 20 is a schematic view showing a configuration of a cylindrical superconducting multilayer composite member according to an embodiment of the invention.

Next, referring to FIG. 20, description will be directed to the structure of the static magnetic field generating source 13 implemented in a superconducting multilayer composite structure.

The main body of the static magnetic field generating source 13 made of a superconducting multilayer composite member is implemented substantially in the form of a cylindrical member having a substantially uniform thickness. As can be seen in FIG. 20, an inner diameter D2 of the cylindrical member at an end thereof is smaller than an inner diameter D1 at a center or intermediate portion thereof. Further, the cylindrical static magnetic field generating source 13 made of the superconducting multilayer composite member is implemented in such a geometrical configuration which is symmetrical relative to a longitudinal or center axis 39 so that a uniform static magnetic field can be generated along the longitudinal center axis 39 of the cylindrical space. Among others, in the case of the superconducting magnet apparatus shown in FIG. 20, the cylindrical superconducting multilayer composite member 13 is so formed that the diameter thereof decreases gradually in the direction toward to ends thereof from the center. The shape of the transversal section of the cylindrical superconducting multilayer composite member 13 may be a part of a circle as well.

Figure 21:
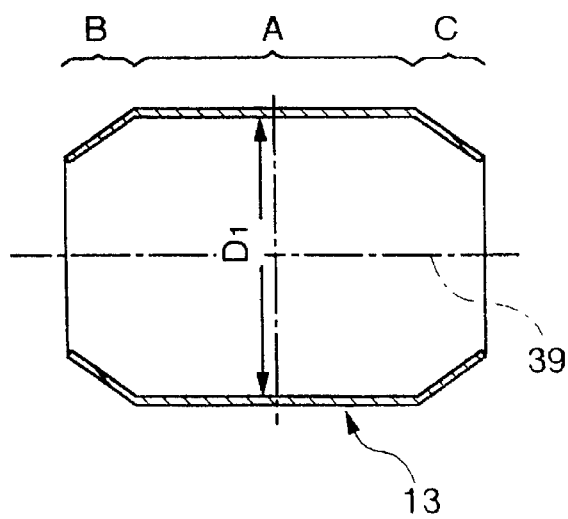
FIG. 21 is a schematic view showing another configuration of a cylindrical superconducting multilayer composite member according to another embodiment of the invention.

FIG. 21 shows yet another embodiment of the static magnetic field generating source 13 according to the present invention. In the case of the instant embodiment of the invention, the static magnetic field generating source 13 made of a superconducting multilayer composite member has three regions, i.e., an intermediate region A having a predetermined constant diameter and two end regions B and C formed in continuation to the intermediate region A, wherein the end regions B and C are shaped in the form of a frustum of cone in the axial section. With the arrangement of the superconducting magnet apparatus shown in FIG. 21, advantageous effects similar to FIG. 20 can be obtained, whereby distribution uniformity of the static magnetic field as a whole can further be enhanced.

Figure 22:
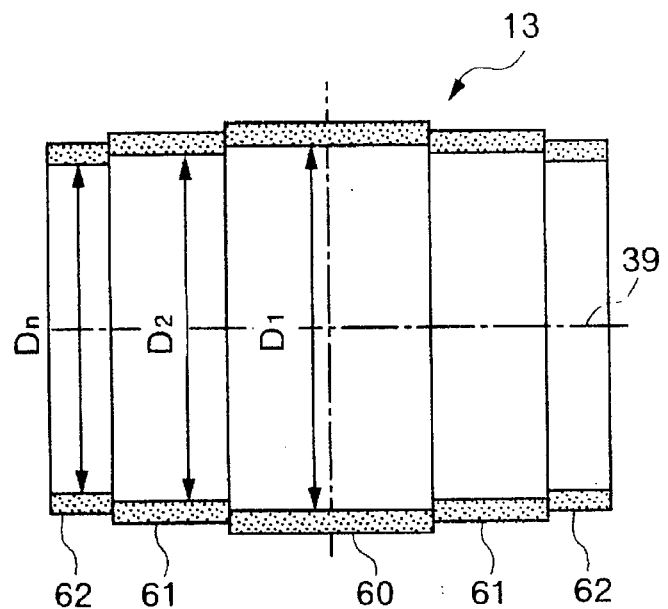
FIG. 22 is a schematic view showing another structure of a cylindrical superconducting multilayer composite member according to yet another embodiment of the invention.

FIG. 22 shows a structure of a static magnetic field generating source 13 according to yet another exemplary embodiment of the present invention. In the case of the static magnetic field generating source according to the instant embodiment of the invention, the static magnetic field generating source 13 made of a cylindrical superconducting multilayer composite member is constituted by a plurality of cylindrical members 60, 61 and 62 which have diameters sequentially reduced in this order. In the case of the illustrated embodiment, it is assumed that the number of the cylindrical bodies is five. In this case, the individual cylindrical bodies need not be directly interconnected but it is sufficient to array the cylindrical bodies regularly so that the axial magnetic fields generated by the individual cylindrical bodies can not substantially be disturbed, as illustrated in FIG. 22. Although it is assumed that five cylindrical bodies are employed for constituting the superconducting multilayer composite cylinder, it goes without saying that the aimed object of the present invention can be achieved by using at least three cylindrical bodies. In that case, it goes without saying that the length of the cylindrical body 60 has to be increased, as occasion requires. Furthermore, it is obvious that by increasing the number of the cylindrical bodies or members, substantially same advantageous effects as those of the structure shown in FIG. 20 can be obtained.

Since the superconducting magnet apparatus according to the instant embodiment of the invention can be constituted by using only the cylindrical members having predetermined diameters, respectively, there can be achieved advantageous effect that troublesome processing is eliminated.

It should be understood that the structures described above are only for the purpose of exemplary illustrations of the concept of the present invention. Since numerous modifications and combinations will readily occur to those skilled in the art without departing from the spirit and scope of the present invention, it is not intended to limit the invention to the exact construction and operation illustrated and described. By way of example, although the end region is implemented in a frustoconical shape in the case of the superconducting magnet apparatus shown in FIG. 21, it should be appreciated that the peripheral surface of the cone need not be linear but can be curvilinear so that the diameter decreases gradually toward the end region.

By making the diameter of the cylindrical superconducting multilayer composite member at both ends thereof be smaller than that of the intermediate portion, locations at which leakage of the magnetic flux may occur can be positioned remote from the center or intermediate portion, whereby uniformity of the magnetic flux distribution along the whole length of the superconducting magnet apparatus can be improved over the cylindrical body having a same diameter over the whole length, which in turn means that the superconducting magnet apparatus can be implemented in a further reduced size.

Figure 23:
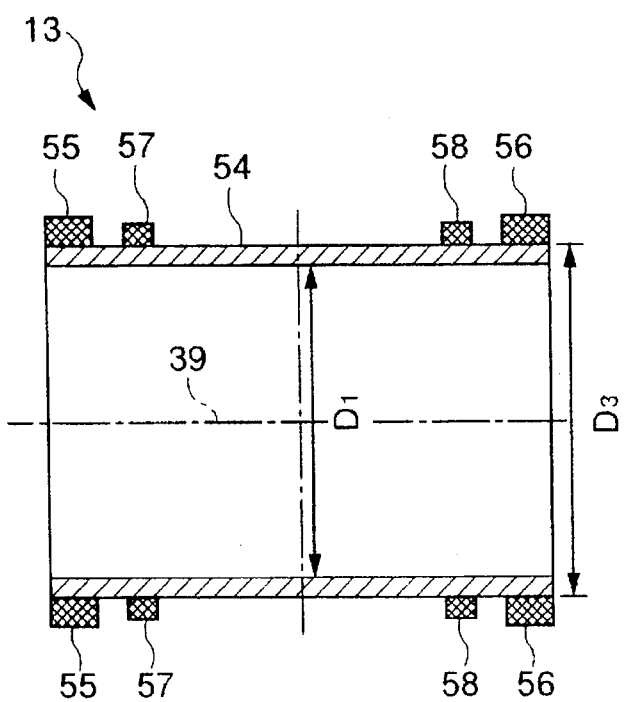
FIG. 23 is a schematic view showing still another structure of a cylindrical superconducting multilayer composite member according to a further embodiment of the invention.

Next, referring to FIG. 23, description will be directed to a static magnetic field generating source implemented by using a superconducting multilayer composite member according to a further embodiment of the present invention.

The static magnetic field generating source 13 made of the superconducting multilayer composite member according to the embodiment now of concern is comprised of a first cylindrical superconducting multilayer composite tube 54 having a predetermined diameter $D_1$ and a substantially uniform wall thickness, second cylindrical superconducting multilayer composite tubes 55 and 56 each having a diameter $D_3$ slightly greater than that of the first cylindrical tube 54 and third cylindrical superconducting multilayer composite tubes 57 and 58 having a same diameter D3 as the tubes 55 and 56. Each of the third cylindrical tubes 57 and 58 has a length slightly shorter than that of the second cylindrical tubes 55 and 56. So far as the conditions mentioned are satisfied, the lengths of the second and third cylindrical tubes 55; 56 and 57; 58 can be selected rather arbitrarily within a certain range. What is important is to increase the intensity or strength of the magnetic field in the vicinity of the end portions of the main or first cylindrical tube 54 so that the magnetic flux leaking from the end apertures extends in higher parallelism with the center axis 39 when compared with the single cylindrical tube. Accordingly, it is preferred to dispose at least three kinds of cylindrical tubes differing one another in the length in such an array that the lengths of the cylindrical tubes decrease sequentially from an end of the tube array toward the center thereof in order to enhance further the uniformity of the parallel magnetic field.

The embodiments of the superconducting magnet apparatus described above are simply for the purpose of illustrating the concept of the present invention. To say in another way, numerous versions or modifications will readily occur to those skilled in the art without departing from the spirit and scope of the present invention. By way of example, in the case of the superconducting multilayer composite member shown in FIG. 23, the first cylindrical tube 54 and the second cylindrical tubes 55 and 56 are so arrayed that the ends thereof are in alignment with one another. However, it is equally possible to adopt such arrangement that a portion of the second cylindrical tube extends outwardly beyond the end of the first cylindrical tube. Further, although the diameter of the second cylindrical tube is selected greater than that of the first cylindrical tube, it goes without saying that such dimensional relation may be reversed. Further, it should be mentioned that the tubes constituting the superconducting magnet apparatus need not necessarily be of cylindrical form but may be so realized as to have, for example, an elliptical cross-section so as to conform more closely to a shape or form of an object under inspection or diagnosis.

At any rate, in the case of the superconducting magnet apparatus described in this embodiment, the magnetic fluxes are so corrected that the direction thereof becomes parallel to the center axis in the vicinity of both ends of the cylindrical superconducting multilayer composite member by virtue of the double-tube arrangement, whereby the uniformity of the magnetic flux can be improved over the whole length of the superconducting magnet apparatus constituted by the superconducting multilayer composite members when compared with the single cylindrical magnet having a same diameter over the whole length thereof.

Figure 24:
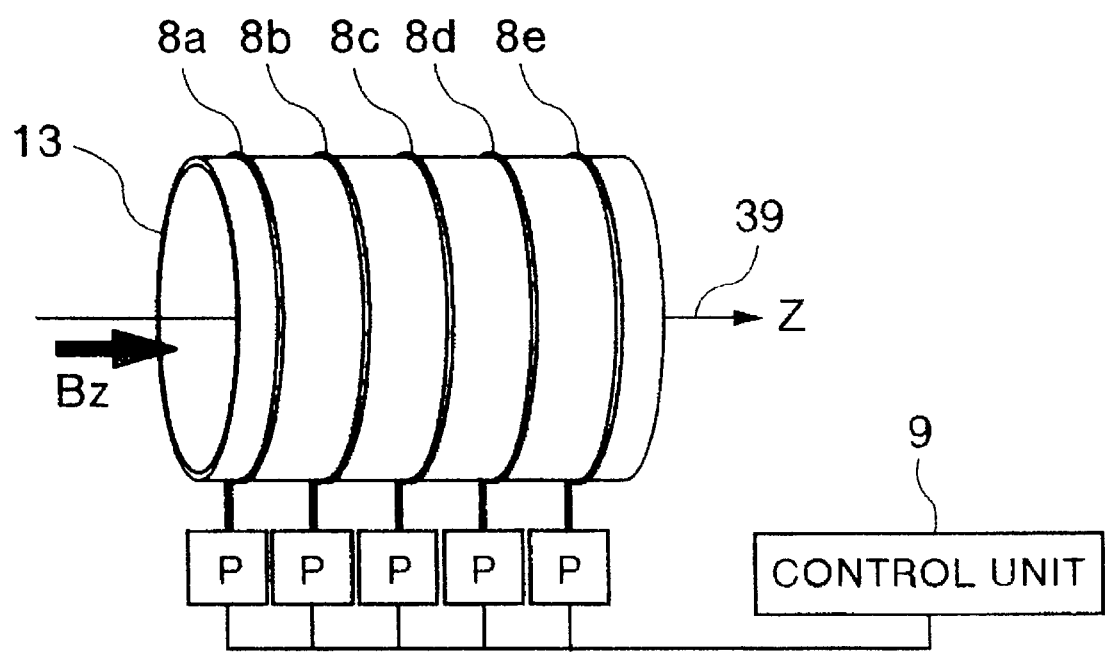
FIG. 24 is a schematic view showing an arrangement for unformizing a magnetic flux distribution by heating locally a cylindrical superconducting multilayer composite member according to still another embodiment of the present invention.

FIG. 24 shows a static magnetic field generating source made of a superconducting multilayer composite member according to still another embodiment of the present invention. In the figure, a reference numeral 13 denotes a cylindrical static magnetic field generating source implemented by using a superconducting multilayer composite member and having a center axis 39. A magnetic resonance imaging system is realized by making use of a magnetic field within a cylinder at a center of the cylindrical static magnetic field generating source in the longitudinal direction (Z-direction) thereof. Further, reference character $B_z$ indicates a direction of the magnetic flux forming the magnetic field. Mounted on the cylindrical superconducting multilayer composite member 13 are surface heater segments 8a, ... 8e independent of one another, wherein power supply sources P are provided for heating the individual heater segments, respectively, in combination with a control unit 9 for controlling the power supply sources P.

With the structure of the cylindrical static magnetic field generating source described above, shimming is performed with the aid of the heaters on the assumption that the superconducting multilayer composite member 13 is magnetized.

When in the magnetized static is such that the direction of the magnetic flux coincides with the direction $B_z$ shown in FIG. 24, the persistent current in the cylindrical superconducting multilayer composite member 13 generating continuously the magnetic flux is flowing in the circumferential direction of the cylinder. In general, the magnetic field within a coil of solenoid type at a center thereof becomes lowered in the Z-direction toward the end face from the center. In an effort to compensate for such variation in the magnetic-field intensity in the Z-direction, there has heretofore been adopted such as arrangement that the number of turns of the winding is increased toward both ends from the center thereof. By contrast, in the case of the cylindrical superconducting multilayer composite member 13, the current is distributed in the Z-direction over the whole length of the cylindrical member in dependence on the shape and the characteristics of the superconducting multilayer composite member. Accordingly, for correcting the current distribution in the cylindrical superconducting multilayer composite member as in the case of the conventional winding-type magnet apparatus, it is proposed to divide the cylinder 13 made of the superconducting multilayer composite member into n segments or sections in the Z-direction for controlling the current flows in these segments after magnetization to thereby realize the effect equivalent to the compensation attained conventionally by increasing the number of turns of the winding toward the end face of the cylindrical coil. To this end, the current distribution is so controlled that the currents flowing at the center portion of the cylinder as viewed in the longitudinal direction are smaller than those flowing at both end portions.

Figure 25A:
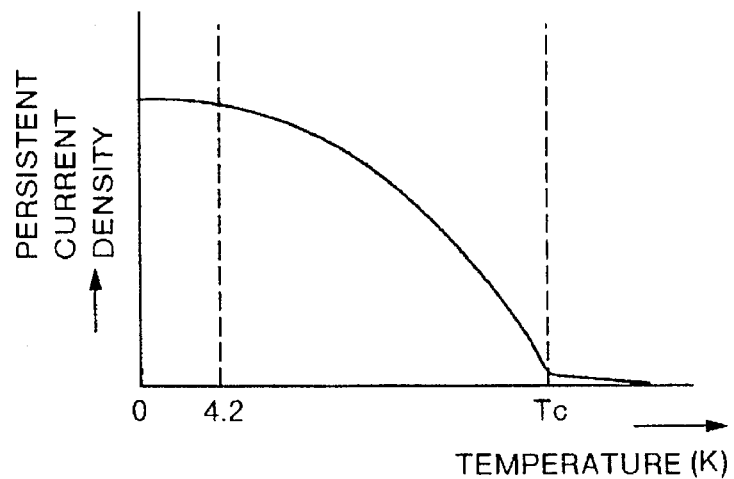
FIGS. 25A and 25B are views for graphically illustrating the concept underlying the arrangement shown in FIG. 24.
Figure 25B:
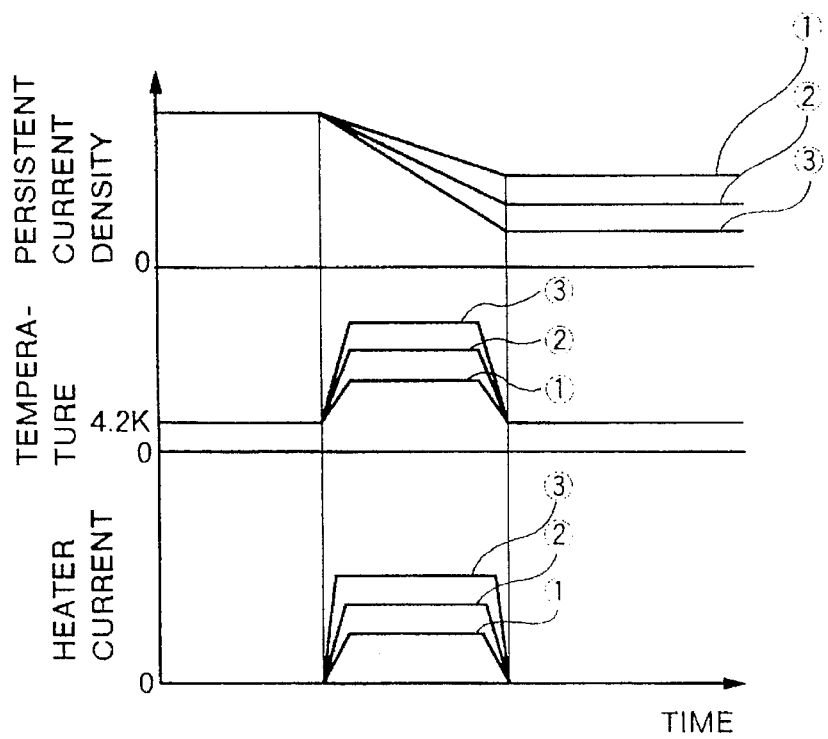

The control operation according to the instant embodiment of the invention will be elucidated by reference to FIG. 25A which illustrates graphically a relation between the persistent current in the cylinder 13 made of superconducting multilayer composite member and the temperature thereof. As can be seen from the figure, when a NbTi-alloy type superconducting member is operated in the state cooled by liquid helium, the temperature for operation is usually around 4.2K within a range limited by a critical temperature $T_C$. At this juncture, it should be mentioned that the superconducting state disappears in a temperature range higher than 9K. Thus, it can be seen from FIG. 25A, the persistent current has a maximum value at a temperature of 4.2K and assumes a minimum value at a temperature $T_c$. Accordingly, it is taught by the present invention incarnated in the instant embodiment that the within the range of the maximum to minimum current level, the values of the persistent currents flowing through the cylinder segments mentioned above are controlled by changing or controlling the temperature of the cylinder made of superconducting multilayer composite member on a segment-by-segment basis, to thereby regulate or adjust the magnetic fields generated by the persistent currents on the segment-by-segment basis. FIG. 25B is a view for graphically illustrating a control procedure to this end. More specifically, there are employed three different levels of heater currents ①, ② and ③ on such condition that ①<②<③. The temperatures of the heaters increase in proportion to the heater currents ①, ② and ③. Consequently, the amount of decreasement of persistent current density becomes larger sequentially in the order of ①, ② and ③ with respect to the value at the temperature 4.2K. In this way, the persistent current flowing in the cylinder 13 made of the superconducting multilayer composite member can be adjusted to respective desired levels, whereby the intended object of the invention can be accomplished.

In the foregoing, description has been made on the assumption that the superconducting magnet apparatus is constituted by a multilayer composite cylinder. It should however be mentioned that in the case of the superconducting magnet apparatus where disks each of the superconducting multilayer composite member are employed, similar advantageous effects can equally be achieved. Besides, by modifying the positions or dispositions at which the heaters are installed or the density thereof, a fine adjustment of the persistent current can be achieved even in the case of the superconducting magnet apparatus of such a configuration which presents a great difficulty in adjusting the persistent current distribution as in the case of the winding type superconducting magnet apparatus known heretofore. Moreover, even with the control such that the critical temperature $T_C$ is exceeded sometimes, there can be realized a stable operation, differing from the winding type superconducting magnet apparatus known heretofore, which owes to one of the advantageous features provided by the cylinder 13 made of the superconducting multilayer composite member.

Furthermore, although it has been described that the superconducting multilayer composite member 13 is implemented in the form of the single cylinder, such arrangement may equally be conceived in which the cylinder is divided into n sections each of which is provided with a heater, wherein the control mentioned above is performed for each of the cylinder sections substantially to the same or more advantageous effects.

The magnetization of the superconducting multilayer composite cylinder can be realized by resorting to any given one of the methods (1), (2) and (3) described hereinbefore.

Figure 26:
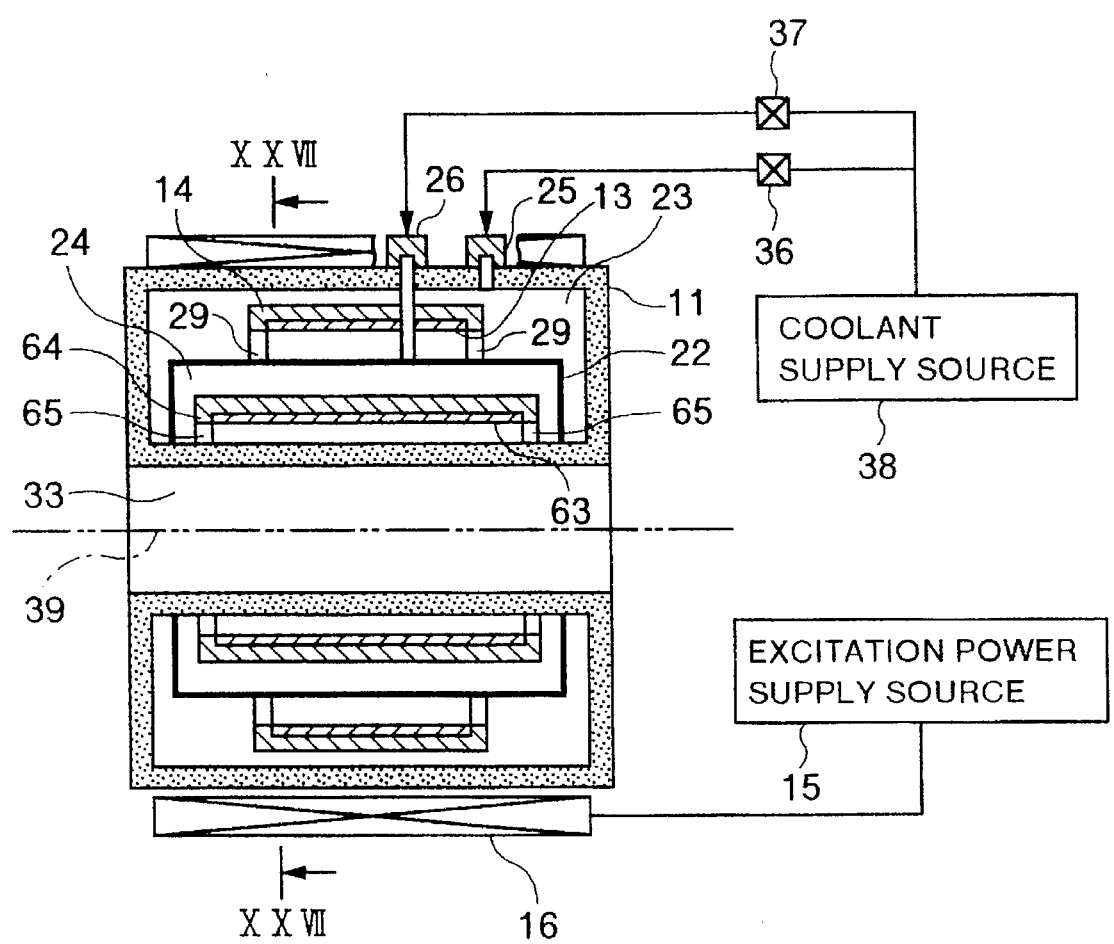
FIG. 26 is a view showing a superconducting magnet apparatus including a static magnetic field generating source constituted by a superconducting multilayer composite member and a shim according to a still further embodiment of the present invention.
Figure 27:
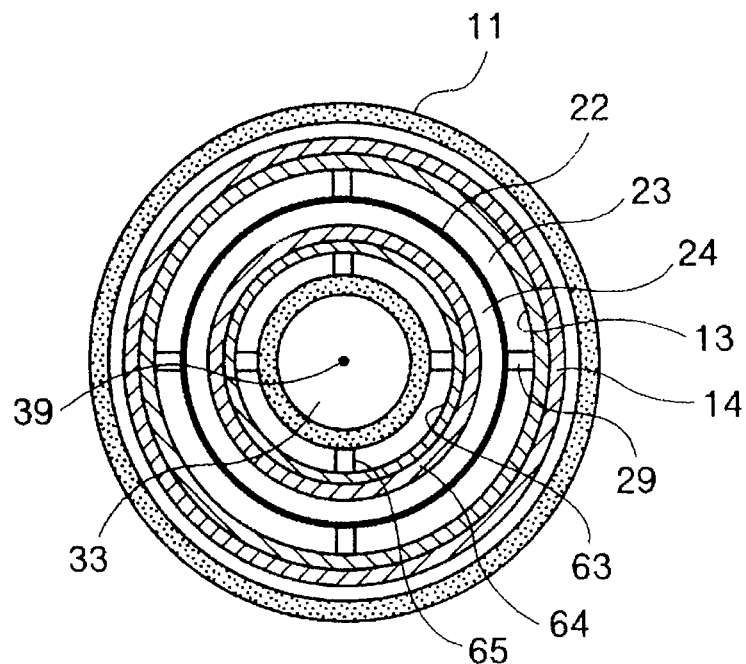
FIG. 27 is a sectional view of the same taken along a line XXVII—XXVII in FIG. 26.

FIG. 26 shows a superconducting magnet apparatus according to a still further embodiment of the present invention. Further, FIG. 27 is a sectional view of the same taken along a line XXVII—XXVII in FIG. 26. In these figures, parts or components serving for same or equivalent functions of those mentioned previously are designated by like reference characters.

In the figures, reference numeral 11 denotes a cryostat vessel which is thermally insulated from the exterior and which is partitioned into two coolant chambers 23 and 24 by partition 22. Accommodated within the chambers 23 and 24 is liquid helium serving as a coolant for realizing the superconductivity. The cryostat vessel 11 is provided with coolant injecting ports 25 and 26 for injecting or pouring liquid helium into both the coolant chambers, respectively. Disposed within the coolant chamber 23 is a cylindrical body 13 made of a superconducting multilayer composite member which serves as a static magnetic field generating source, wherein the cylindrical body or member 13 is supported by a supporting member which is secured to the partition 22 formed with an appropriate number coolant passage through-holes 29 so that liquid helium can freely flow therethrough. On the other hand, a cylindrical superconducting multilayer composite member 63 is disposed within the coolant chamber 24 and supported by a supporting member 64 which in turn is fixedly secured to the cryostat vessel 11 and has an appropriate number of coolant passage through-holes 65 which allow liquid helium to freely flow therethrough.

Disposed outside of the cryostat vessel 11 of the static magnetic field generating source, is a magnetizing coil 16 which is electrically connected to an excitation power supply source 15. On the other hand, the coolant injecting ports 25 and 26 are connected to the coolant supply source 38 by way of the valves 36 and 37, respectively. By removing the caps of the coolant injecting ports 25 and 26 and opening the valves 36 and 37, liquid helium, i.e., coolant for realizing the superconductivity is charged into the coolant chambers 23 and 24, respectively.

At first, the coolant chamber 23 is evacuated to an empty state with the coolant chamber 24 being filled with liquid helium. In this state, an excitation current is supplied to the magnetizing coil 16 from the excitation power supply source 15. The magnetizing coil 16 is of a solenoid type. When the excitation current flows through the magnetizing coil 16, a magnetic flux of a loop-like distribution which passes through a hollow portion of the magnetizing coil 16 is generated to thereby form an external magnetic field for the magnetization. The loop-like magnetic flux has a loop portion extending from one end of each of the cylindrical body 13 and shim 63, through inner sides of the cylindrical body 13 and shim 63, to the other end of each of the cylindrical body 13 and shim 63, and rounding outside of the magnetizing coil 16. At any rate, these loop-like magnetic fluxes give rise to generation of an induced current flowing through the cylindrical body 13 in the circumferential direction thereof. However, because of the normal conducting state, the induced current is rapidly attenuated to zero. In this case, there is induced in the shim 63 made of the superconducting multilayer composite member a superconducting current which inhibits passage of the magnetic flux in accordance with the superconductivity characteristics.

Subsequently, the coolant chamber 23 is filled with liquid helium. Thus, the cylindrical body 13 is cooled down to the temperature at which the cylindrical body 13 assumes the superconducting state. Accordingly, when the excitation current supplied to the magnetizing coil 16 from the excitation power supply source 15 is decreased to zero, there is generated in the cylindrical body 13 a superconducting current for holding the magnetic flux in accordance with the characteristics of the superconducting multilayer composite member, which current is held as the persistent current. Thus, a loop-like magnetic flux is generated by the persistent current. This magnetic flux loop extends through the space 33 along the center axis 39 of the cylindrical body 13, as a result of which a static magnetic field continues to be generated along the center axis 39. Once the cylindrical body 13 has been magnetized, the magnetizing coil 16 is removed away from the outside of the cryostat vessel 11, and the space 33 in which the static magnetic fields are uniformly generated can now be utilized for disposition of an object for inspection whose magnetic resonance image is to be taken.

The shim made of the superconducting multilayer composite member immersed within the coolant and disposed between the static magnetic field generating source 13 and the axis 39 so as to surround the latter serves for the function of a magnetic shield. Accordingly, the magnetic flux generated from the static magnetic field generating source 13 constituted by the superconducting multilayer composite member passes through both end portions of the shim 63 and the space 33. Consequently, the uniformity of the static magnetic field formed in the space 33 is enhanced as compared with the structure in which the shim 63 is absent. Furthermore, by determining appropriately the dimension of the shim 63 in the axial direction, the range in which the static magnetic field formed within the space 33 is uniform can be extended or enlarged along the axis 39.

Figure 28:
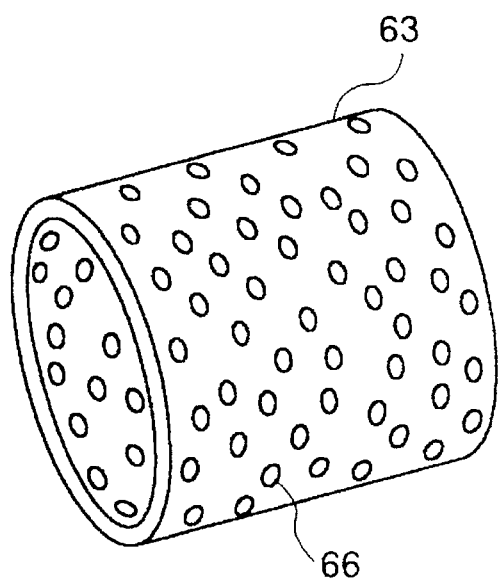
FIG. 28 is a view showing a shim according to a yet further embodiment of the invention.

FIG. 28 shows a modification of the shim 63 of the superconducting multilayer composite member shown in FIG. 26. The shim according to the instant embodiment of the invention has a group of static magnetic field correcting holes 66. Parts of the magnetic flux generated by the static magnetic field generating source 13 enter the space 33 by way of the group of static magnetic field correcting holes 66 to thereby exert influence to the static magnetic field formed within the space 33. Accordingly, by determining properly the distribution, the number, size and the shape of the static magnetic field correcting holes 66, local correction of the static magnetic field is rendered possible, as a result of which the uniformity of the static magnetic field as a whole can further be improved.

Figure 29:
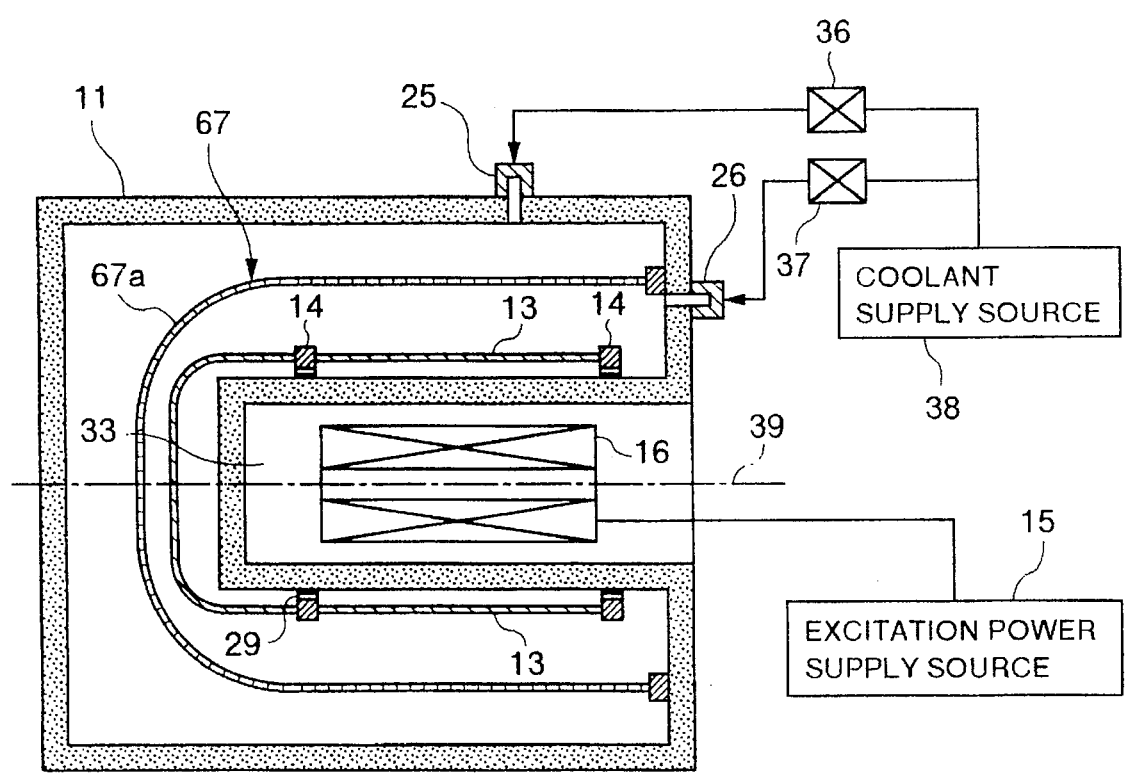
FIG. 29 is a sectional view showing yet another embodiment of a superconducting magnet apparatus including a static magnetic field generating source constituted by a superconducting multilayer composite member according to another embodiment of the present invention.

FIG. 29 shows yet another embodiment of the superconducting magnet apparatus according to the present invention.

In the case of the superconducting magnet apparatus now of concern, the static magnetic field generating source 13 of the superconducting multilayer composite member is configuration such that open end thereof is closed or partially opened.

According to the teaching of the invention incarnated in the superconducting magnet apparatus, the magnetic shield 67 implemented by using the superconducting multilayer composite member is disposed within the cryostat coolant so as to cover the static magnetic field generating source 13 at the side opposite to the axis 39 and at one end thereof. The superconducting multilayer composite member can exhibit magnetic shield characteristics which are excellent over that of the ordinary iron sheet. Accordingly, the magnetic field leakage from the static magnetic field generating source 13 can effectively be suppressed by the magnetic shield 67. In particular, at the front of the aperture of the magnetic shield 67, leakage of the magnetic flux to the rear side of a spherical portion 67a of the magnetic shield 67 can effectively be prevented although the magnetic field leakage to the front side can not completely be suppressed. Accordingly, the space behind the spherical portion 67a (i.e., rear space behind the aperture in an extreme case) can be utilized as a space free of magnetism.

By providing a partition within the cryostat vessel 11 while disposing the static magnetic field generating source 13 within the first coolant chamber with the magnetic shield 67 in the second coolant chamber, the first chamber can be evacuated to the empty state or filled with the coolant independent of the second coolant chamber. With this arrangement, influence of excitation of the magnetic shield 67 can completely be eliminated.

As further modifications of the superconducting magnet apparatus, there can be conceived a structure in which the magnetic shield shown in FIG. 29 is spared and a structure in which both ends of the static magnetic field generating source 13 are opened, as in the case of the superconducting magnet apparatus shown in FIG. 1A.

Figure 30:
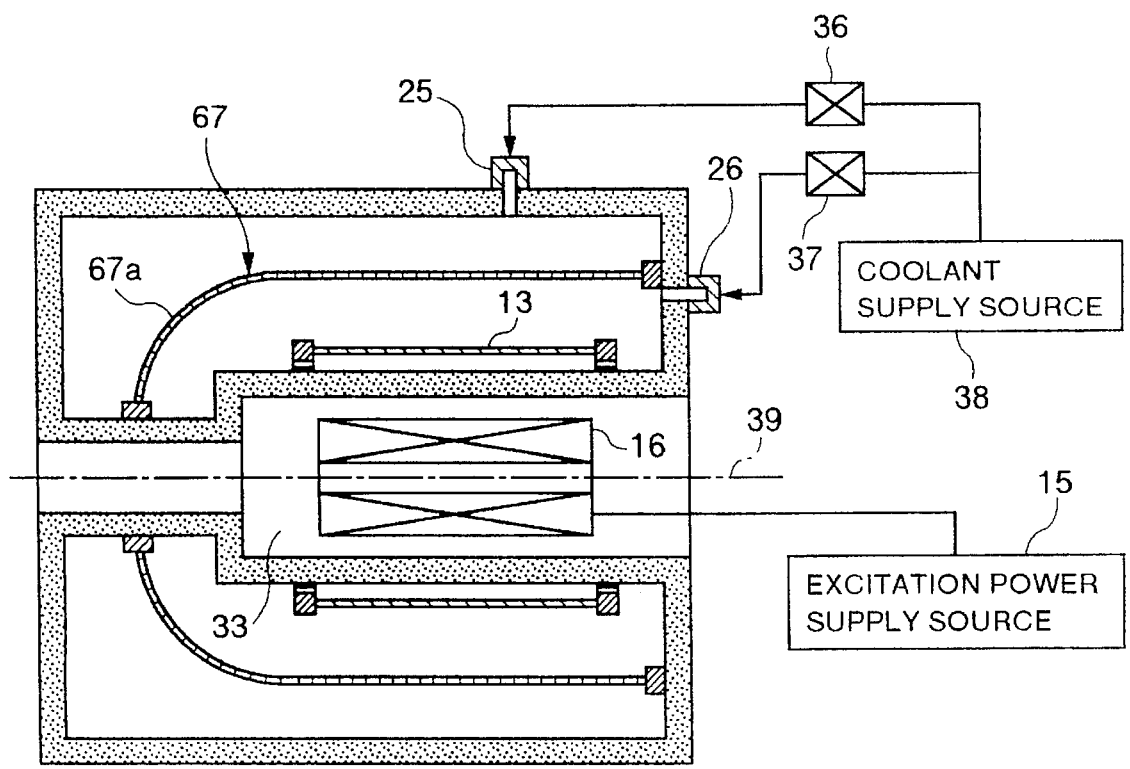
FIG. 30 is a view showing a superconducting magnet apparatus including a superconducting multilayer composite member as a static magnetic field generating source and having a space for accommodating an object for inspection with high openness according to an embodiment of the invention.
Figure 31:
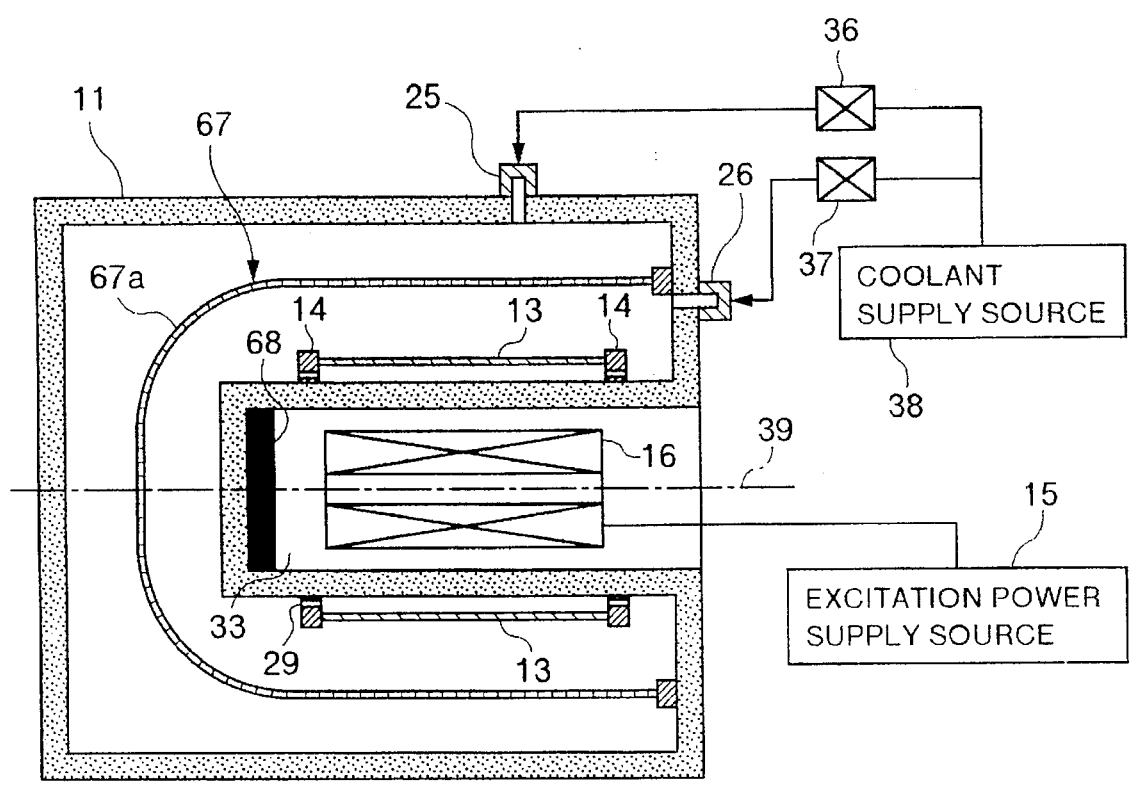
FIG. 31 is a view similar to FIG. 30 and shows a superconducting magnet apparatus provided with a mirror for enhancing openness of a space for accommodating an object for inspection.

FIGS. 30 and 31 show, respectively, further exemplary embodiments of the superconducting magnet apparatus according to the invention.

In the case of the superconducting magnet apparatus shown in FIG. 30, an opening of a size corresponding to a cross-sectional area of an object under inspection is formed in a spherical portion 67a of a magnetic shield 67 substantially at a center thereof. This arrangement is excellent in respect to openness, ventilation and lighting. In other respects, the apparatus shown in FIG. 30 is substantially same as the structure shown in FIG. 29. On the other hand, in the case of the superconducting magnet apparatus shown in FIG. 31, an optical reflector or mirror 68 is provided at an end portion of the magnetic shield 67 mentioned above. By providing an optical reflector such as the mirror 68 in this manner, the depth of the space can be extended in appearance, whereby openness of the space can be enhanced. Of course, it is possible to use an illumination instead of the optical reflector for illuminating the space for accommodating an object under inspection. Except for the provision of a facility for lighting the space, the structure as well as operations of the superconducting magnet apparatus shown in FIG. 29.

Figure 32:
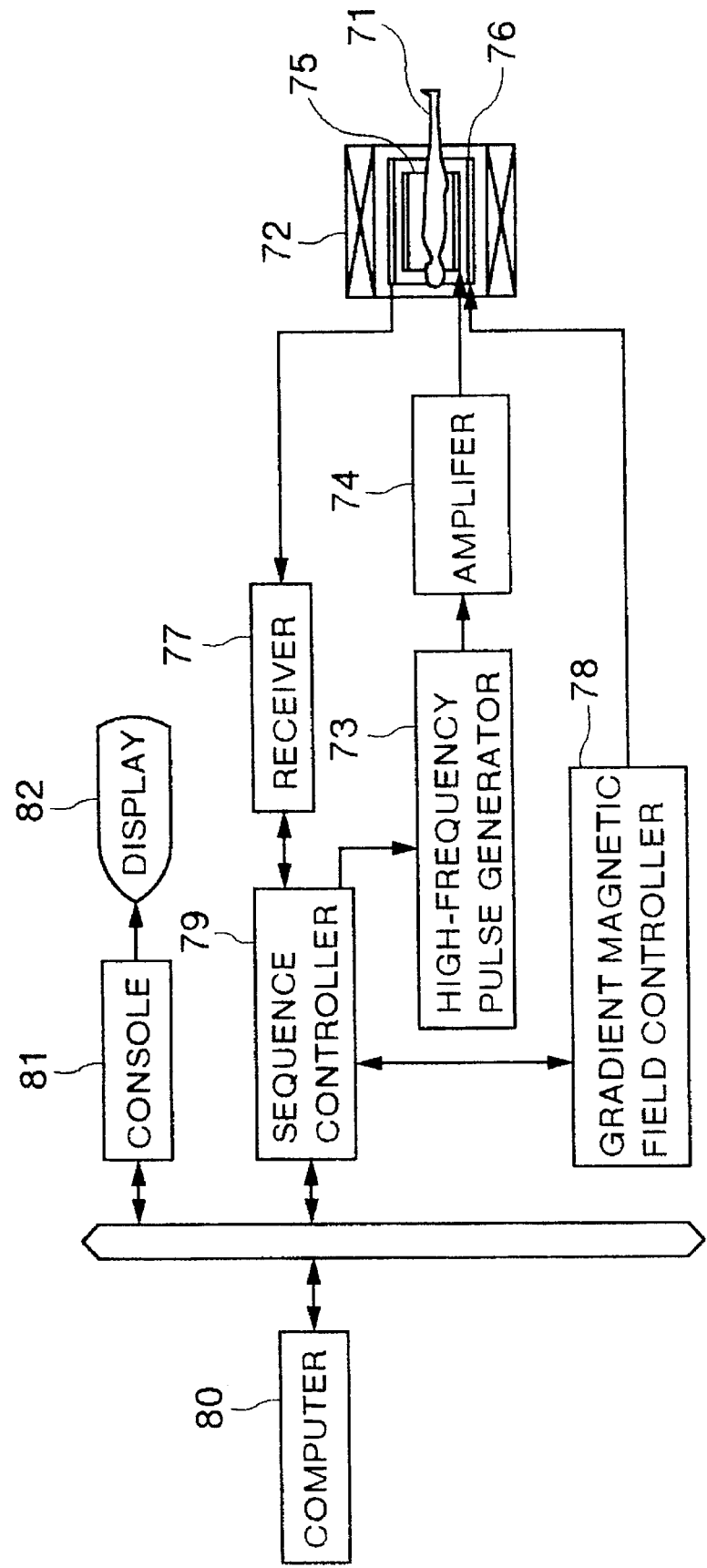
FIG. 32 is a block diagram showing schematically a hardware structure of a magnetic resonance imaging system in which a superconducting multilayer composite member is used as a static magnetic field generating source.

FIG. 32 is a block diagram showing schematically a hardware structure of a magnetic resonance imaging system in which a superconducting multilayer composite member is used as a static magnetic field generating source. An object 71 for inspection or diagnosis is disposed within a static magnetic field generated by a superconducting magnet apparatus 72 including the static magnetic field generating source implemented in the superconducting multilayer composite structure. A high-frequency pulse generated by a high-frequency pulse generator 73 is amplified by an amplifier 74 to be subsequently supplied to a transceiver coil 75, as a result of which the object 71 under inspection is irradiated with an electromagnetic wave. Thus, in the object 71 under inspection, nuclear spins are excited. The nuclear magnetic resonance signals generated by the nuclear spins of the object 71 under inspection excited in this manner are detected by the transceiver coil 75 to be supplied to a receiver 77. A gradient magnetic field generating coil 76 is controlled by a gradient magnetic controller 78 to generate gradient magnetic fields in the X-, Y- and Z-directions to thereby define a particular slicing plane. These gradient magnetic fields are superposed on the static magnetic field.

A sequence controller 79 is connected to the gradient magnetic field controller 78, the high-frequency pulse generator 73 and the receiver 77 for controlling generation of the high-frequency pulse signal in accordance with a predetermined pulse sequence, generation of the gradient magnetic fields in the X-, Y- and Z-directions and the nuclear magnetic resonance signal reception timing. Further, under the control of the sequence controller 79, a computer 80 performs an image reconstructing processing on the basis of the nuclear magnetic resonance signals introduced to the receiver 77, the result of which is displayed on a display unit 82 by way of a console 81 provided for controlling information/data transfer.

With the magnetic resonance imaging system shown in FIG. 32 in which the static magnetic field generating source implemented by the superconducting multilayer composite member is employed, numerous pulse sequences known heretofore such as various spin-echo methods, echo planer methods and others can be carried out to obtain tomographic images. Furthermore, with various pulse sequences which will be developed in the future, tomographic images can be taken by the magnetic resonance imaging system using the static magnetic field generating source implemented by the superconducting multilayer composite member.

I claim:

1. A superconducting magnet apparatus, comprising:
   a cryostat vessel for containing therein coolant for realizing superconductivity;
   magnetic flux generating means disposed within said cryostat vessel and including a NbTi/Nb/Cu superconducting multilayer composite member constituting a sustaining medium for holding a persistent current which generates a magnetic flux along a center axis of a predetermined magnetic field space; and
   means for holding said magnetic flux generating means within said cryostat vessel.

2. A superconducting magnet apparatus according to claim 1,
   wherein said magnetic flux generating means includes a cylindrical superconducting multilayer composite member having a center axis which coincides with said center axis of said predetermined magnetic field space.

3. A superconducting magnet apparatus according to claim 1,
   wherein said magnetic flux generating means includes a plurality of planar superconducting multilayer composite members disposed orthogonally to said center axis and having holes formed around said center axis.

4. A superconducting magnet apparatus according to claim 1,
   wherein magnetic flux generating means further includes magnetizing coil means disposed in a coaxial circular array around said center axis for magnetizing said superconducting multilayer composite member.

5. A superconducting magnet apparatus according to claim 4,
   wherein said magnetizing coil means is disposed externally of said superconducting multilayer composite member.

6. A superconducting magnet apparatus comprising:
   a cryostat vessel for containing therein coolant for realizing superconductivity;
   magnetic flux generating means disposed within said cryostat vessel and including a superconducting multi layer composite member constituting a sustaining medium for holding a persistent current which generates a magnetic flux along a center axis of a predetermined magnetic field space; and means for holding said magnetic flux generating means within said cryostat vessel;

wherein said magnetic flux generating means includes a cylindrical superconducting multi layer composite member having a center axis which coincides with said center axis of said predetermined magnetic field space; and wherein said superconducting multi layer composite member has a reduced diameter at those portions which are closed to an end thereof than at a center portion thereof.

7. A superconducting magnet apparatus comprising:

a cryostat vessel for containing therein coolant for realizing superconductivity;

magnetic flux generating means disposed within said cryostat vessel and including a superconducting multi layer composite member constituting a sustaining medium for holding a persistent current which generates a magnetic flux along a center axis of a predetermined magnetic field space; and means for holding said magnetic flux generating means within said cryostat vessel;

wherein said magnetic flux generating means includes a cylindrical superconducting multi layer composite member having a center axis which coincides with said center axis of said predetermined magnetic field space; and wherein said magnetic flux generating means has at least three cylindrical superconducting multi layer composite members having diameters differing from one another, and said at least three cylindrical super conducting multi layer composite members are disposed in an array such that said diameters sequentially decrease in a direction from a center portion of said array toward an end portion thereof.

8. A superconducting magnet apparatus comprising:

a cryostat vessel for containing therein coolant for realizing superconductivity;

magnetic flux generating means disposed within said cryostat vessel and including a superconducting multi layer composite member constituting a sustaining medium for holding a persistent current which generates a magnetic flux along a center axis of a predetermined magnetic field space; and means for holding said magnetic flux generating means within said cryostat vessel;

wherein said magnetic flux generating means includes a cylindrical superconducting multi layer composite member having a center axis which coincides with said center axis of said predetermined magnetic field space; and wherein said magnetic flux generating means includes, first cylindrical superconducting multi layer composite member having a first diameter; and at least one second cylindrical superconducting multi layer composite member partially overlapping said first cylindrical superconducting multi layer composite member in a coaxial circular array, said second cylindrical superconducting multi layer composite member having a length shorter than that of said first cylindrical superconducting multi layer composite member.

9. A superconducting magnet apparatus comprising:

a cryostat vessel for containing therein coolant for realizing superconductivity;

magnetic flux generating means disposed within said cryostat vessel and including a superconducting multi layer composite member constituting a sustaining medium for holding a persistent current which generates a magnetic flux along a center axis of a predetermined magnetic field space; and means for holding said magnetic flux generating means within said cryostat vessel;

wherein said magnetic flux generating means includes a cylindrical superconducting multi layer composite member having a center axis coinciding with said center axis of said predetermined magnetic flux space, and one end of said cylindrical superconducting multi layer composite member is completely closed.

10. A superconducting magnet apparatus comprising:

a cryostat vessel for containing therein coolant for realizing superconductivity;

magnetic flux generating means disposed within said cryostat vessel and including a superconducting multi layer composite member constituting a sustaining medium for holding a persistent current which generates a magnetic flux along a center axis of a predetermined magnetic field space; and means for holding said magnetic flux generating means within said cryostat vessel;

wherein said magnetic flux generating means includes a cylindrical superconducting multi layer composite member having one end thereof partially closed.

11. A superconducting magnet apparatus comprising:

a cryostat vessel for containing therein coolant for realizing superconductivity;

magnetic flux generating means disposed within said cryostat vessel and including a superconducting multi layer composite member constituting a sustaining medium for holding a persistent current which generates a magnetic flux along a center axis of a predetermined magnetic field space; and means for holding said magnetic flux generating means within said cryostat vessel;

wherein said magnetic flux generating means further includes a magnetic shield constituted by a second cylindrical superconducting multi layer composite member having one end thereof completely closed so as to cover said cylindrical superconducting multi layer composite member.

12. A superconducting magnet apparatus according to claim 11, further comprising:

means for lighting said magnetic flux space at a side where the opening portion of said magnetic shield is closed.

13. A superconducting magnet apparatus comprising:

a cryostat vessel for containing therein coolant for realizing superconductivity;

magnetic flux generating means disposed within said cryostat vessel and including a superconducting multi layer composite member constituting a sustaining medium for holding a persistent current which generates a magnetic flux along a center axis of a predetermined magnetic field space; and means for holding said magnetic flux generating means within said cryostat vessel;

wherein said magnetic flux generating means further includes a magnetic shield constituted by a second cylindrical superconducting multi layer composite member having one end thereof partially closed so as to cover said cylindrical superconducting multi layer composite member.

14. A superconducting magnet apparatus comprising:

a cryostat vessel for containing therein coolant for realizing superconductivity;

magnetic flux generating means disposed within said cryostat vessel and including a superconducting multi layer composite member constituting a sustaining medium for holding a persistent current which generates a magnetic flux along a center axis of a predetermined magnetic field space; and means for holding said magnetic flux generating means within said cryostat vessel;

wherein said magnetic flux generating means further includes a plurality of shims for adjusting a distribution of magnetic flux, said shims being formed by a superconducting multi layer composite member disposed at an inner side of said cylindrical superconducting multi layer composite member so as to surround said center axis.

15. A superconducting magnet apparatus according to claim 14, wherein said shims are formed with a plurality of holes.

16. A superconducting magnet apparatus according to claim 14, wherein said cryostat vessel includes first and second coolant chambers isolated from each other, and said superconducting multilayer composite member is disposed within said first coolant chamber while said shim is disposed within said second coolant chamber.

17. A superconducting magnet apparatus comprising:

a cryostat vessel for containing therein coolant for realizing superconductivity;

magnetic flux generating means disposed within said cryostat vessel and including a superconducting multi layer composite member constituting a sustaining medium for holding a persistent current which generates a magnetic flux along a center axis of a predetermined magnetic field space; and means for holding said magnetic flux generating means within said cryostat vessel;

said magnetic flux generating means further including:

heating means for locally heating said superconducting multi layer composite member; and means for locally controlling temperatures of said superconducting multi layer composite member by means of said heating means for thereby adjusting uniformity of the magnetic field as generated.

18. A superconducting magnet apparatus according to claim 17, wherein said heating means includes at least one surface heater disposed on a surface of said superconducting multilayer composite member.

19. A superconducting magnet apparatus comprising:

a cryostat vessel for containing therein coolant for realizing superconductivity;

magnetic flux generating means disposed within said cryostat vessel and including a superconducting multi layer composite member constituting a sustaining means for holding a persistent current which generates a magnetic flux along a center axis of a predetermined magnetic field space; and means for holding said magnetic flux generating means within said cryostat vessel;

wherein said persistent current sustaining means has a thermal expansion coefficient substantially equal to that of said magnetic flux generating means.

20. A superconducting magnet apparatus comprising:

a cryostat vessel for containing therein coolant for realizing superconductivity;

magnetic flux generating means disposed within said cryostat vessel and including a superconducting multi layer composite member constituting a sustaining medium for holding a persistent current which generates a magnetic flux along a center axis of a predetermined magnetic field space; and means for holding said magnetic flux generating means within said cryostat vessel;

wherein said magnetic flux generating means includes:

a tubular superconducting multi layer composite member bent so that opened end faces thereof face in opposition to each other with a predetermined space being interposed therebetween; and magnetizing coil means for magnetizing said tubular superconducting multi layer composite member;

wherein said cryostat vessel is so configured as to form said predetermined space externally of said cryostat vessel.

21. A superconducting magnet apparatus according to claim 20, wherein magnetic flux generating means further includes plate-like shims disposed in parallel to and in the vicinity of said opened end faces, said shim being constituted by a superconducting multilayer composite member and having at least one hole.

22. A superconducting magnet apparatus, comprising:

a cryostat vessel for accommodating therein a coolant for realizing superconductivity, said cryostat vessel being so configured as to enclose a space in which an object under inspection is disposed;

magnetic flux generating means provided within said cryostat vessel and constituted by a pair of disk-like superconducting multilayer composite members disposed in opposition to each other with an interposition of said space therebetween, each of said disk-like superconducting multilayer composite members having an opening formed at a center portion thereof and generating a magnetic flux by a current flowing around said opening, said magnetic flux passing through said space and extending in a direction substantially perpendicular to said pair of disk-like superconducting multilayer composite members; and means for holding said magnetic flux generating means within said cryostat vessel.

23. A superconducting magnet apparatus according to claim 22, wherein each of said pair of disk-like superconducting multilayer composite members constituting said magnetic flux generating means includes at least two disk-like superconducting multilayer composite members disposed in superposition to each other with a predetermined distance therebetween.

24. A superconducting magnet apparatus according to claim 22, wherein a pair of magnetic shield plates are constituted by disk-like superconducting multilayer composite members, respectively, and said magnetic shield plates are disposed to face in opposition to each other with interposition of said pair of disk-like superconducting multilayer composite members and said space therebetween.

25. A magnetic resonance imaging system, comprising:

a superconducting magnet apparatus including:

a cryostat vessel for accommodating therein a coolant for realizing superconductivity, said cryostat vessel being so configured as to enclose a space in which an object under inspection is disposed;

magnetic flux generating means disposed within said cryostat vessel and including a NbTi/Nb/Cu superconducting multilayer composite member serving as a sustaining medium for a persistent current which generates a static magnetic field passing through said space; and means for holding said static magnetic field generating means within said cryostat vessel;

gradient magnetic field generating means for generating a gradient magnetic field to be superposed onto said static magnetic field;

high-frequency pulse applying means for applying a high-frequency electromagnetic wave pulse to said object under inspection;

control means for controlling said gradient magnetic field and said high-frequency electromagnetic wave pulse signal in accordance with a predetermined pulse sequence so that nuclear magnetic resonance signals can be generated from said object under inspection; and means for constructing a tomographic image of said object under inspection on the basis of said nuclear magnetic resonance signals.

26. A magnetic resonance imaging system according to claim 25, wherein said static magnetic field generating means includes magnetizing means for magnetizing said superconducting multilayer composite member.

27. A method of magnetizing a superconducting magnet apparatus, comprising the steps of:

generating a magnetic flux of a predetermined value within a space enclosed by a superconducting multi layer composite member by flowing an excitation current through a magnetizing coil;

lowering gradually said excitation current in a state in which said superconducting multi layer composite member is maintained at a temperature lower than a temperature at which said superconducting multi layer composite member assumes a superconducting state, to thereby generate a superconducting current in said superconducting multi layer composite member; and sustaining said superconducting current as a persistent current in said superconducting multi layer composite member by setting to zero generation of the magnetic flux from said magnetizing coil in the state where said superconducting multi layer composite member is maintained at the temperature at which said superconducting multi layer composite member assumes the superconducting state;

wherein said step of generating said magnetic flux of said predetermined value includes a step of generating the magnetic flux of said predetermined value by means of said magnetizing coil at a temperature which is higher than the temperature at which said superconducting multi layer composite member assumes a superconducting state.

28. A method of magnetizing a superconducting magnet apparatus, comprising the steps of:

generating a magnetic flux of a predetermined value within a space enclosed by a superconducting multi layer composite member by flowing an excitation current through a magnetizing coil;

lowering gradually said excitation current in a state in which said superconducting multi layer composite member is maintained at a temperature lower than a temperature at which said superconducting multi layer composite member assumes a superconducting state, to thereby generate a superconducting current in said superconducting multi layer composite member; and sustaining said superconducting current as a persistent current in said superconducting multi layer composite member by setting to zero generation of the magnetic flux from said magnetizing coil in the state where said superconducting multi layer composite member is maintained at the temperature at which said superconducting multi layer composite member assumes the superconducting state;

wherein said step of generating said magnetic flux of said predetermined value includes a step of generating the magnetic flux of said predetermined value by means of said magnetizing coil at a temperature lower than a temperature at which said superconducting multi layer composite member assumes the superconducting state.

29. A method of magnetizing a superconducting magnet apparatus, comprising the steps of:

generating a magnetic flux of a predetermined value within a space enclosed by a superconducting multi layer composite member by flowing an excitation current through a magnetizing coil;

lowering gradually said excitation current in a state in which said superconducting multi layer composite member is maintained at a temperature lower than a temperature at which said superconducting multi layer composite member assumes a superconducting state, to thereby generate a superconducting current in said superconducting multi layer composite member; and sustaining said superconducting current as a persistent current in said superconducting multi layer composite member by setting to zero generation of the magnetic flux from said magnetizing coil in the state where said superconducting multi layer composite member is maintained at the temperature at which said superconducting multi layer composite member assumes the superconducting state;

wherein said step of generating the magnetic flux of said predetermined value includes the substeps of:

generating a magnetic flux of said predetermined value by means of said magnetizing coil at a temperature lower than a temperature at which said superconducting multi layer composite member assumes the superconducting state;

heating said superconducting multi layer composite member to a temperature higher than the temperature at which said superconducting multi layer composite member assumes the superconducting state in the state in which the magnetic flux of said predetermined value is generated; and resetting said superconducting multi layer composite member again to the superconducting state in the state in which the magnetic flux of said predetermined value is generated.

30. A method of magnetizing a superconducting magnet apparatus, in which a first superconducting multilayer composite member is disposed around a predetermined axis so that a space is formed through which said axis extends interiorly, while disposing a second superconducting multilayer composite member around said predetermined axis so as to cover said first superconducting multilayer composite member by said second superconducting multilayer composite member, said method comprising the steps of:

setting said second superconducting multilayer composite member to a superconducting state and maintaining said superconducting state;

generating a magnetic flux of a predetermined value within said space enclosed by said first superconducting multilayer composite member by flowing an excitation current through a magnetizing coil;

lowering gradually said excitation current in a state in which said first superconducting multilayer composite member is maintained at a temperature lower than a temperature at which said first superconducting multilayer composite member assumes a superconducting state, to thereby generate a superconducting current in said superconducting multilayer composite member; and sustaining said superconducting current as a persistent current in said first superconducting multilayer composite member by setting to zero generation of the magnetic flux from said magnetizing coil in the state where said first superconducting multilayer composite member is maintained at the temperature lower than a temperature at which said first superconducting multilayer composite member assumes the superconducting state.

31. A method of magnetizing a superconducting magnet apparatus according to claim 30, further comprising the step of pushing back magnetic flux extending toward an end of said space in a direction toward said second superconducting multilayer composite member by magnetic flux impeding means when said magnetic flux is generated by said magnetizing coil.

32. A superconducting magnet apparatus, comprising:

a cryostat vessel for containing therein coolant for realizing superconductivity;

magnetic flux generating means disposed within said cryostat vessel and including a superconducting multi layer composite member comprising a plurality of metallic layers, said superconducting multi layer composite member constituting a sustaining medium for holding a persistent current which generates a magnetic flux along a center axis of a predetermined magnetic field space; and means for holding said magnetic flux generating means within said cryostat vessel.

33. A superconducting magnet apparatus as claimed in claim 32, wherein said plurality of metallic layers is more specifically one of a stacked and laminated plurality of metallic layers.

34. A superconducting magnet apparatus as claimed in claim 33, wherein said plurality of metallic layers is more specifically one of a hot-rolled and cold-rolled plurality of metallic layers.

35. A superconducting magnet apparatus as claimed in claim 34, wherein said plurality of metallic layers is more specifically alternating NbTi, Nb and Cu layers.

* * * * *